US012712257B2

(12) United States Patent
Jeon et al.

(10) Patent No.: US 12,712,257 B2
(45) Date of Patent: Aug. 18, 2026

(54) ANTENNA MODULE INCLUDING STRUCTURE FOR EXTENDING GROUND AND ELECTRONIC DEVICE INCLUDING SAME

(71) Applicant: Samsung Electronics Co., Ltd., Suwon-si (KR)

(72) Inventors: Sinhyung Jeon, Suwon-si (KR); Sanggi Oh, Suwon-si (KR); Jeongnam Cheon, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 26 days.

(21) Appl. No.: 18/908,429

(22) Filed: Oct. 7, 2024

(65) Prior Publication Data

US 2025/0030149 A1 Jan. 23, 2025

Related U.S. Application Data

(63) Continuation of application No. PCT/KR2023/003853, filed on Mar. 23, 2023.

(30) Foreign Application Priority Data

Apr. 22, 2022 (KR) ........................ 10-2022-0049938
May 25, 2022 (KR) ........................ 10-2022-0064328

(51) Int. Cl.
*H01Q 1/22* (2006.01)
*H01Q 1/24* (2006.01)
(Continued)

(52) U.S. Cl.
CPC ......... *H01Q 1/2283* (2013.01); *H01Q 1/2291* (2013.01); *H01Q 1/243* (2013.01);
(Continued)

(58) Field of Classification Search
CPC .... H01Q 1/2283; H01Q 1/2291; H01Q 1/243; H01Q 1/38; H01Q 1/521; H01Q 1/526;
(Continued)

(56) References Cited

U.S. PATENT DOCUMENTS 6,034,640 A * 3/2000 Oida ...................... H01Q 1/362
343/722
7,777,677 B2 * 8/2010 Bungo ..................... H01Q 1/38
343/895
(Continued)

FOREIGN PATENT DOCUMENTS

JP 2011097392 A * 5/2011 ............. H01Q 1/243
JP 2012119932 A * 6/2012 ............... H01Q 9/42
(Continued)

OTHER PUBLICATIONS

International Search Report for PCT /KR2023/003853 mailed Jul. 4, 2023, 5 pages.

(Continued)

*Primary Examiner* — Ab Salam Alkassim, Jr.
(74) *Attorney, Agent, or Firm* — Nixon & Vanderhye P.C.

(57) ABSTRACT

An electronic device according to an embodiment includes: a printed circuit board; a first antenna module including at least one antenna; a second antenna module including at least one antenna; a Bluetooth module comprising circuitry; and at least one processor, comprising processing circuitry, wherein the first antenna module includes: a chip antenna; a feeding line; at least one first ground area; a set of first conductive patterns; and a first lumped element comprising a conductive material, set including a first lumped element, a second lumped element, a third lumped element, and a fourth lumped element. A third conductive pattern, fourth conductive pattern, and the at least one first ground area
(Continued)

form a closed loop by the second lumped element, the third lumped element, and the fourth lumped element.

17 Claims, 9 Drawing Sheets

(51) Int. Cl.
*H01Q 1/38* (2006.01)
*H01Q 1/52* (2006.01)
*H01Q 21/28* (2006.01)
*H05K 1/02* (2006.01)

(52) U.S. Cl.
CPC ............... *H01Q 1/38* (2013.01); *H01Q 1/521* (2013.01); *H01Q 1/526* (2013.01); *H01Q 21/28* (2013.01); *H05K 1/0237* (2013.01); *H05K 2201/10098* (2013.01)

(58) Field of Classification Search
CPC ................. H01Q 21/28; H05K 1/0237; H05K 2201/10098
See application file for complete search history.

(56) References Cited

U.S. PATENT DOCUMENTS 7,859,471 B2 * 12/2010 Bungo ................... H01Q 5/321 343/702
8,581,799 B2 * 11/2013 Choi ...................... H01Q 5/335 343/846
9,059,510 B2 * 6/2015 Harper ..................... H01Q 5/40
9,088,072 B2 * 7/2015 Takaki ..................... H01Q 5/40
9,142,888 B2 * 9/2015 Yukimoto ............. H01Q 1/243
10,461,793 B2 * 10/2019 Lee ........................ H01Q 13/10
10,797,376 B2 * 10/2020 Tu .......................... H01Q 1/243
2007/0285335 A1 * 12/2007 Bungo ................... H01Q 5/371 343/895
2011/0102270 A1 * 5/2011 Nagatomo ............. H01Q 21/30 343/700 MS
2013/0088398 A1 * 4/2013 Utagawa .................. H01Q 1/38 343/745
2013/0249742 A1 * 9/2013 Yukimoto ............ H01Q 1/2283 343/700 MS
2013/0265207 A1 * 10/2013 Yukimoto ................ H01Q 9/42 343/860
2014/0203992 A1 * 7/2014 Nakano .................. H01Q 1/243 343/867
2015/0035713 A1 * 2/2015 Goto ........................ H01Q 5/50 343/749
2016/0181698 A1 * 6/2016 Goto ...................... H01Q 1/362 343/870
2018/0123242 A1 * 5/2018 Jeon ......................... H01Q 5/30
2020/0388925 A1 * 12/2020 Tanbo .................... H01Q 5/371
2021/0320396 A1 * 10/2021 Kim ..................... H01Q 9/0421
2021/0367326 A1 * 11/2021 Chen ........................ H01Q 1/38
2025/0007167 A1 * 1/2025 Hanninen .............. H01Q 5/364

FOREIGN PATENT DOCUMENTS

JP 2013093660 A 5/2013
JP 2014127946 A * 7/2014
JP 2014150502 A * 8/2014
JP 5617736 B2 * 11/2014 ............... H01Q 1/38
JP 5656108 B2 12/2014
JP 2014233030 A * 12/2014
JP 2016100687 A 5/2016
JP 2016134773 A * 7/2016
JP 6048271 B2 12/2016
JP 2017038153 A * 2/2017
JP 6766660 B2 9/2020
JP 6857315 B2 3/2021
KR 100893505 B1 4/2009
KR 101003014 B1 12/2010
KR 20130040813 A 4/2013
KR 101599522 B1 3/2016
KR 101800910 B1 11/2017
KR 20180046694 A 5/2018

OTHER PUBLICATIONS

Written Opinion of the ISA for PCT /KR2023/003853 mailed Jul. 4, 2023, 4 pages.

* cited by examiner

ANTENNA MODULE INCLUDING STRUCTURE FOR EXTENDING GROUND AND ELECTRONIC DEVICE INCLUDING SAME

CROSS-REFERENCE TO RELATED APPLICATIONS

This application is a continuation of International Application No. PCT/KR2023/003853 designating the United States, filed on Mar. 23, 2023, in the Korean Intellectual Property Receiving Office and claiming priority to Korean Patent Application Nos. 10-2022-0049938, filed on Apr. 22, 2022, and 10-2022-0064328, filed on May 25, 2022, in the Korean Intellectual Property Office, the disclosures of each of which are incorporated by reference herein in their entireties.

BACKGROUND

Field

The disclosure relates to an antenna module including a structure for extending a ground and an electronic device including the same.

Description of Related Art

An electronic device may include one or more electronic components to provide various functions to a user. For example, the electronic device may include at least one antenna for communicating with an external electronic device. The antenna may be disposed in the electronic device in a form of an antenna module in which a metal pattern for performing a role of an antenna radiator is disposed on a printed circuit board.

As an electronic device becomes miniaturized, a size of an antenna module disposed in the electronic device may decrease. As the size of the antenna module decreases, a size of a ground in the antenna module may become smaller since a size of a printed circuit board in the antenna module decreases. When the size of the ground becomes small, performance of the antenna may deteriorate or difficulty in adjusting a radiation pattern of the antenna may occur. In a case where the size of the printed circuit board is simply increased to secure the size of the ground of the antenna module, a problem of increased manufacturing cost of the antenna module or enlargement of the size of the antenna module may occur. The electronic device may require an antenna module including a structure for extending the ground while having a reduced size.

The technical problems to be addressed in this disclosure are not limited to those described above, and other technical problems not mentioned herein will be clearly understood by those having ordinary knowledge in the art to which the present disclosure belongs, from the following description.

SUMMARY

An electronic device according to an example embodiment may comprise: a printed circuit board (PCB) including a first region extending in a first direction, and a second region extending in a second direction perpendicular to the first region, a first antenna module including at least one antenna disposed on the first region, a second antenna module including at least one antenna spaced apart from the first antenna module in the first direction and disposed on the first region, a Bluetooth module comprising circuitry disposed on the second region, and at least one processor, comprising processing circuitry, operatively coupled to the first antenna module, the second antenna module, and the Bluetooth module. According to an example embodiment, the first antenna module may comprise a chip antenna, a feeding line extending from at least one processor to an end of the chip antenna, at least one first ground region surrounding the chip antenna and the feeding line and disposed along at least portion of a periphery of the first region. According to an example embodiment, the first antenna module may comprise a set of first conductive patterns including a first conductive pattern connected to another end of the chip antenna, a second conductive pattern spaced apart from the first conductive pattern and extending in the first direction, a third conductive pattern disposed between the second conductive pattern and the at least one first ground region, and a fourth conductive pattern disposed between the third conductive pattern and the at least one first ground region. According to an example embodiment, the first antenna module may comprise a set of first lumped elements comprising a conductive material including a first lumped element connecting the first conductive pattern and the second conductive pattern, a second lumped element connecting the third conductive pattern and a portion of the at least one first ground region, a third lumped element connecting the third conductive pattern and the fourth conductive pattern, and a fourth lumped element connecting the fourth conductive pattern and another portion of the at least one first ground region different from the portion of the at least one first ground region. According to an example embodiment, the third conductive pattern, the fourth conductive pattern, and the at least one first ground region may form a closed loop by the second lumped element, the third lumped element, and the fourth lumped element.

An antenna module according to an example embodiment may comprise: a printed circuit board, a chip antenna disposed on the printed circuit board, a feeding line connected to an end of the chip antenna, at least one first ground region surrounding the chip antenna and the feeding line and disposed along at least portion of a periphery of the printed circuit board, a set of first conductive patterns including a first conductive pattern connected to another end of the chip antenna, a second conductive pattern spaced apart from the first conductive pattern and extending in a first direction, a third conductive pattern disposed between the portion of the at least one first ground region and another end of the second conductive pattern, and a fourth conductive pattern spaced apart from the third conductive pattern and extending in a second direction perpendicular to the first direction, and a set of first lumped elements comprising a conductive material including a first lumped element connecting the first conductive pattern and the second conductive pattern, a second lumped element connecting the third conductive pattern and the portion of the at least one first ground region, a third lumped element connecting the third conductive pattern and the fourth conductive pattern, and a fourth lumped element connecting the fourth conductive pattern and another portion of the at least one first ground region, wherein the third conductive pattern, the fourth conductive pattern, and the at least one first ground region may form a closed loop by the second lumped element, the third lumped element, and the fourth lumped element.

An antenna module and an electronic device including the same according to various example embodiments can provide a structure for extending a ground, since a plurality of conductive patterns and a ground region that are spaced apart from each other may form a closed loop by being connected to each other by a plurality of lumped elements.

The effects that can be obtained from the present disclosure are not limited to those described above, and any other effects not mentioned herein will be clearly understood by those having ordinary knowledge in the art to which the present disclosure belongs, from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
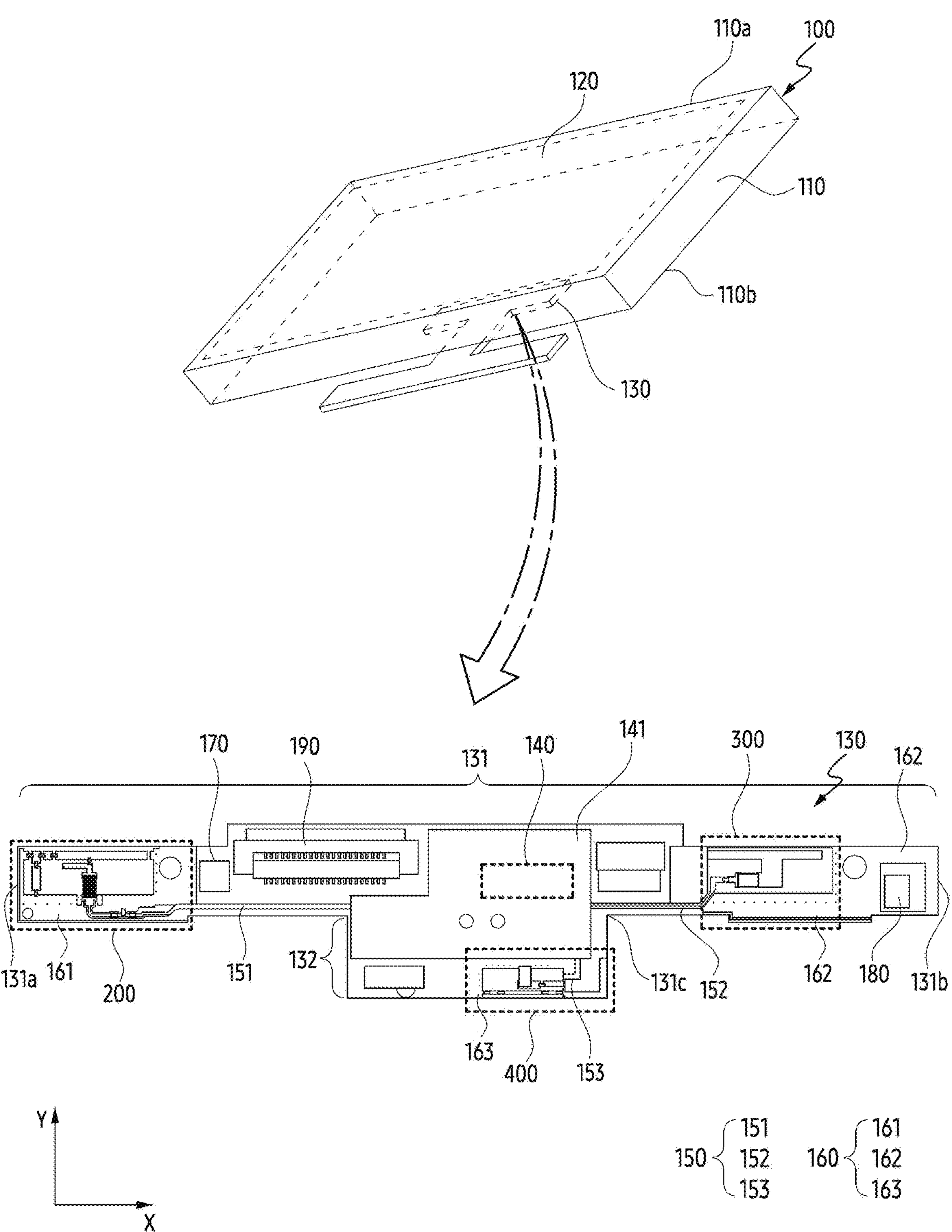
FIG. 1 is a diagram illustrating an example electronic device according to various embodiments.

FIG. 1 is a diagram illustrating an example electronic device according to various embodiments.

Referring to FIG. 1, according to an embodiment, an electronic device 100 may include at least one electronic component to provide various functions to a user. According to an embodiment, the electronic device 100 may be configured to provide the user with visual information including an image (e.g., a still image or video) based on receiving a signal received from an external electronic device (not illustrated). For example, the electronic device 100 may be implemented as various devices capable of playing video content through a display, such as a smart TV, a tablet, a monitor, a smartphone, a desktop computer, a laptop computer, navigation, and digital signage, but the electronic device 100 is not limited to the aforementioned devices. The electronic device 100 may, according to embodiments, further include various other configurations necessary for operation of the implemented device in addition to the configuration illustrated in FIG. 1.

According to an embodiment, the electronic device 100 may include a housing 110, a display 120, a printed circuit board 130, at least one processor (e.g., comprising processing circuitry) 140, a shield can 141, feeding lines 150, ground regions 160, a first microphone 170, a second microphone 180, a connector 190, a first antenna module (e.g., including at least one antenna) 200, a second antenna module (e.g., including at least one antenna) 300, and/or a Bluetooth module (e.g., including various circuitry) 400.

The housing 110 may form at least a portion of an outer surface of the electronic device 100. According to an embodiment, the housing 110 may form an internal space in which at least one component disposed in the electronic device 100 is disposed. For example, the housing 110 may be formed integrally without including a coupling member, or may be formed by a plurality of plates coupled to each other through a coupling member.

The display 120 may display visual information (e.g., multimedia data or text data) to the user. According to an embodiment, the display 120 may include various components capable of implementing an image. For example, the display 120 may include a plurality of pixels, and each of the plurality of pixels may include a plurality of sub-pixels. For example, each of the plurality of pixels may be comprise three sub-pixels corresponding to red light, green light, and blue light (R, G, and B). For another example, each of the plurality of pixels may comprise a first sub-pixel that provides red light, a second sub-pixel that provides blue light, and a third sub-pixel and a fourth sub-pixel that provide green light. For another example, each of the plurality of pixels may include sub-pixels that provide light other than red, green, and blue, such as cyan, magenta, yellow, or black. For example, the display 120 may be a liquid crystal display (LCD), a plasma display panel (PDP), an organic light emitting display (OLED), a field emission display (FED), or a white organic light emitting display (WOLED).

According to an embodiment, the display 120 may form at least a portion of a front surface of the electronic device 100 by being disposed on a surface 110*a* of the housing 110. The front surface of the electronic device 100 may refer to a surface of the electronic device 100 facing the user when the user uses the electronic device 100. According to an embodiment, the display 120 may be parallel to the surface 110*a* of the housing 110, but is not limited thereto. For example, the display 120 may have a curved shape with respect to the surface 110*a* of the housing 110.

The printed circuit board 130 may form an electrical connection between electronic components that perform the overall operation of the electronic device 100. According to an embodiment, the printed circuit board 130 may form an electrical connection between at least one electronic component for establishing a communication channel between the electronic device 100 and an external electronic device (not illustrated). For example, the printed circuit board 130 and at least one electronic component disposed on the printed circuit board 130 may form a communication module or a radio-frequency module (RF module). According to an embodiment, the printed circuit board 130 may be disposed in the housing 110. For example, the printed circuit board 130 may be disposed between the surface 110*a* of the housing 110 and another surface 110*b* of a housing 110*b* facing the surface 110*a* of the housing 110. According to an embodiment, the printed circuit board 130 may include a first region 131 extending in a first direction (e.g., +x direction) and a second region 132 extending in a second direction (e.g., −y direction) perpendicular to the first direction. The second region 132 may be connected to the first region 131. For example, the second region 132 may be connected to a portion 131*c* of the first region 131 spaced apart from both peripheries 131*a* and 131*b* of the first region 131. The periphery may refer, for example, to a portion of one component that includes a boundary that distinguishes the one component from other components among regions included in the one component, and the corresponding expression may be used identically hereinafter unless otherwise stated. The portion 131*c* of the first region 131 may be disposed between a first periphery 131*a* of the first region 131 facing a third direction (e.g., −x direction) opposite the first direction and a second periphery 131*b* of the first region 131 facing the first direction.

The at least one processor 140 may include various processing circuitry and transmit a communication signal for communication with an external electronic device to the first antenna module 200, the second antenna module 300, and/or the Bluetooth module 400. For example, the communication signal may include a signal for wireless communication with an external electronic device. According to an embodiment, the at least one processor 140 may electrically connected to other electronic components disposed on the printed circuit board 130 by being disposed on the printed circuit board 130. For example, the at least one processor 140 may be operatively coupled to the first antenna module 200, the second antenna module 300, and/or the Bluetooth module 400. The at least one processor 140 may transmit a control signal for controlling the overall operation of the first antenna module 200, the second antenna module 300, and the Bluetooth module 400 to at least one among the first antenna module 200, the second antenna module 300, and the Bluetooth module 400. The at least one processor 140 may receive the signal for communication with an external electronic device from at least one among the first antenna module 200, the second antenna module 300, and/or the Bluetooth module 400. For example, the at least one processor 140 may include at least one among a communication processor (CP), a micro controller unit (MCU), and a central processing unit (CPU) for communicating with an external electronic device. Among the at least one processor 140, the CPU may be disposed together with the CP in the shield can 141, but is not limited thereto. For example, as the CPU and the CP are formed integrally, the at least one processor 140 may be manufactured. For another example, the CPU may be disposed on another printed circuit board that is distinct from the printed circuit board 130, and may be electrically connected to the CP disposed on the printed circuit board 130.

The shield can 141 may reduce a tendency of a communication signal generated by the at least one processor 140 from an outside of the shield can 141 to affect other electronic components in the electronic device 100. According to an embodiment, the shield can 141 may be electrically connected to a ground of the printed circuit board 130. For example, the shield can 141 may include a conductive material. The conductive material may include, for example, a metal material such as copper or aluminum, or a composite material in which a filler (e.g., a polymer material such as carbon fiber, carbon black, carbon nanotube (CNT), or nickel coated graphite) is added to the metal material. However, an example of the conductive material is not limited thereto. According to an embodiment, the shield can 141 may be disposed on the at least one processor 140. The shield can 141 may prevent and/or reduce transfer of an electromagnetic wave to the at least one processor 140 by being disposed on the at least one processor 140. According to an embodiment, the shield can 141 may surround the portion 131*c* of the first region 131 and a portion of the second region 132. According to an embodiment, the shield can 141 and the at least one processor 140 may be disposed in the center of the printed circuit board 130. The shield can 141 and the at least one processor 140 may be surrounded by the first antenna module 200, the second antenna module 300, and the Bluetooth module 400. For example, the shield can 141 may be disposed between the first periphery 131*a* of the first region 131 and the second periphery 131*b* of the first region 131.

The feeding lines 150 may provide a path through which power supplied to the first antenna module 200, the second antenna module 300, and/or the Bluetooth module 400 may move. According to an embodiment, the feeding lines 150 may electrically connect the at least one processor 140 to the first antenna module 200, the second antenna module 300, and/or the Bluetooth module 400. According to an embodiment, the feeding lines 150 may include a first feeding line 151 extending from the at least one processor 140 to the first antenna module 200, a second feeding line 152 extending from the at least one processor 140 to the second antenna module 300, and a third feeding line 153 extending from the at least one processor 140 to the Bluetooth module 400. The first feeding line 151 may be connected to the first antenna module 200 by being extended from the shield can 141 in the third direction (e.g., −x direction) opposite to the first direction. The second feeding line 152 may be connected to the second antenna module 300 by being extended from the shield can 141 in the first direction. The third feeding line 153 may be connected to the Bluetooth module 400 by being extended from the shield can 141 in the second direction.

According to an embodiment, the at least one processor 140 may transfer a communication signal to be transmitted to an external electronic device in a form of power to the first antenna module 200, the second antenna module 300, and/or the Bluetooth module 400 through the feeding lines 150. Power transferred to at least one among the first antenna module 200, the second antenna module 300, and/or the Bluetooth module 400 through the feeding lines 150 may be converted into an electromagnetic wave by an antenna radiator of the first antenna module 200, the second antenna module 300, and/or the Bluetooth module 400. As the converted electromagnetic wave is received by the external electronic device, communication between the electronic device 100 and the external electronic device may be implemented.

The ground regions 160 may be electrically connected to the ground of the printed circuit board 130. According to an embodiment, the ground regions 160 may be electrically disconnected from the feeding lines 150. For example, the ground regions 160 may be disposed on the printed circuit board 130 by being spaced apart from the feeding lines 150. According to an embodiment, the ground regions 160 may include at least one first ground region 161 close to the first antenna module 200, at least one second ground region 162 close to the second antenna module 300, and at least one third ground region 163 close to the Bluetooth module 400. According to an embodiment, the at least one first ground region 161 may be disposed along at least a portion of a periphery of the first region 131. For example, the at least one first ground region 161 may be disposed on at least a portion of the first periphery 131*a* of the first region 131 facing the third direction opposite to the first direction. According to an embodiment, the at least one second ground region 162 may be disposed on at least a portion of the second periphery 131*b* of the first region 131 facing the first direction. The at least one third ground region 163 may be disposed on at least a portion of a periphery of the second region 132 facing the second direction.

The first microphone 170 may obtain an audio signal based on receiving a sound wave transferred from an outside of the printed circuit board 130. According to an embodiment, the first microphone 170 may be disposed between the first antenna module 200 and the shield can 141. For example, the first microphone 170 may be spaced apart from the first antenna module 200 in the first direction. According to an embodiment, the first microphone 170 may be electrically connected to the at least one first ground region 161.

The second microphone 180 may obtain the audio signal based on receiving the sound wave transferred from the outside of the printed circuit board 130. According to an embodiment, the second microphone 180 may be disposed on the second periphery 131*b* of the first region 131. For example, the second microphone 180 may be spaced apart from the second antenna module 300 in the first direction. According to an embodiment, the second microphone 180 and the first microphone 170 may be spaced apart from each other by a designated distance. For example, in case that the first microphone 170 and the second microphone 180 are disposed adjacent to each other, as audio interference occurs between the first microphone 170 and the second microphone 180, operating performance of the first microphone 170 and the second microphone 180 may deteriorate. Since the first microphone 170 and the second microphone 180 are disposed by spacing apart from each other by the designated distance, the electronic device 100 according to an embodiment may provide a structure for securing the operation performance of the first microphone 170 and the second microphone 180. According to an embodiment, the second microphone 180 may be electrically connected to the at least one second ground region 162. For example, the second microphone 180 may be surrounded by the at least one second ground region 162.

The connector 190 may electrically connect the printed circuit board 130 to another printed circuit board (not illustrated). For example, the connector 190 may be one of a socket connector and a plug connector of a board to board connector, but is not limited thereto. According to an embodiment, the connector 190 may be disposed between the first antenna module 200 and the second antenna module 300. For example, the connector 190 may be disposed between the first antenna module 200 and the shield can 141.

The first antenna module 200 may transmit a signal to an external electronic device (not illustrated) or receive a signal transferred from the external electronic device. According to an embodiment, the first antenna module 200 may include an antenna radiator made of a conductive material disposed on the printed circuit board 130. For example, a portion of the antenna radiator of the first antenna module 200 may be electrically connected to the first feeding line 151. The antenna radiator of the first antenna module 200 may transmit a signal to the outside of the printed circuit board 130 based on receiving power from the first feeding line 151. The antenna radiator of the first antenna module 200 may transmit a signal to the at least one processor 140 based on receiving a signal from the outside of the printed circuit board 130. According to an embodiment, the first antenna module 200 may be referred to as a Wi-Fi antenna module for wireless fidelity (Wi-Fi) communication. For example, the first antenna module 200 may be a Wi-Fi antenna module that may operate in a 2.4 GHz band and a 5 GHz band, but is not limited thereto. According to an embodiment, the first antenna module 200 may be disposed on the first periphery 131*a* of the first region 131. For example, the first antenna module 200 may be spaced apart from the shield can 141 in the third direction (e.g., −x direction) opposite to the first direction.

The second antenna module 300 may transmit a signal to an external electronic device (not illustrated) or receive a signal transferred from the external electronic device. According to an embodiment, the second antenna module 300 may include the antenna radiator made of the conductive material disposed on the printed circuit board 130. For example, a portion of the antenna radiator of the second antenna module 300 may be electrically connected to the second feeding line 152. The antenna radiator of the second antenna module 300 may transmit a signal to the outside of the printed circuit board 130 based on receiving power from the second feeding line 152. The antenna radiator of the second antenna module 300 may transmit the received signal to the at least one processor 140 based on receiving the signal from the outside of the printed circuit board 130. According to an embodiment, the second antenna module 300 may be referred to as the Wi-Fi antenna module for wireless fidelity (Wi-Fi) communication. For example, the second antenna module 300 may be the Wi-Fi antenna module that may operate in the 2.4 GHz bandwidth and the 5 GHz bandwidth, but is not limited thereto. According to an embodiment, the second antenna module 300 may be disposed in the first region 131 of the printed circuit board 130 by being spaced apart from the first antenna module 200 in the first direction. For example, the second antenna module 300 may be spaced apart from the second periphery 131*b* of the first region 131 facing the first direction. The second antenna module 300 may be disposed between the shield can 141 and the second microphone 180.

According to an embodiment, the first antenna module 200 and the second antenna module 300 may have substantially the same performance. The first antenna module 200 and the second antenna module 300 may transmit a signal to an outside of the electronic device 100 or receive a signal from the outside of the electronic device 100 through a multiple-output and multiple-input (MIMO) method. For example, the first antenna module 200 and the second antenna module 300 may simultaneously receive a signal of different frequency bands or simultaneously receive a signal of the same frequency band.

The Bluetooth module 400 may establish a communication channel for short-range communication between the electronic device 100 and an external electronic device. According to an embodiment, the Bluetooth module 400 may include the antenna radiator made of the conductive material disposed on the printed circuit board 130. For example, a portion of the antenna radiator of the Bluetooth module 400 may be electrically connected to the third feeding line 153. The antenna radiator of the Bluetooth module 400 may transmit a signal to the outside of the printed circuit board 130 based on receiving power from the third feeding line 153. The antenna radiator of the Bluetooth module 400 may transmit a signal to the at least one processor 140 based on receiving a signal from the outside of the printed circuit board 130. For example, the Bluetooth module 400 may be operable in the 2.4 GHz bandwidth, but is not limited thereto. According to an embodiment, the Bluetooth module 400 may be disposed in the second region 132 of the printed circuit board 130.

According to an embodiment, the first antenna module 200, the second antenna module 300, and the Bluetooth module 400 may be disposed on the printed circuit board 130 by being spaced apart from each other. For example, in case that at least a portion among the first antenna module

200, the second antenna module 300, and the Bluetooth module 400 are disposed adjacent to each other, as electromagnetic wave interference occurs between the first antenna module 200, the second antenna module 300, and the Bluetooth module 400, operating performance of the first antenna module 200, the second antenna module 300, and the Bluetooth module 400 may deteriorate. Since the first antenna module 200, the second antenna module 300, and the Bluetooth module 400 are disposed by spacing apart from each other, the electronic device 100 according to an embodiment may provide a structure capable of preventing and/or reducing deterioration in operating performance of the first antenna module 200, the second antenna module 300, and the Bluetooth module 400.

According to an embodiment, an area of the at least one first ground region 161 close to the first antenna module 200 may be smaller than an area of the at least one second ground region 162 close to the second antenna module 300. Since the second antenna module 300 is spaced apart from the second periphery 131*b* of the first region 131, a space between the second antenna module 300 and the second periphery 131*b* may provide a space in which the at least one second ground region 162 is disposed. Since the first antenna module 200 is disposed at the first periphery 131*a* of the first region 131, a space in which the at least one first ground region 161 is disposed may be insufficient compared to the at least one second ground region 162. In case that a size of the at least one first ground region 161 is insufficient, the first antenna module 200 may not secure substantially the same operating performance as the second antenna module 300. In order to extend the area of the at least one first ground region 161, in case that a position of the first antenna module 200 and the first microphone 170 are switched each other, the operation performance of the first antenna module 200 may deteriorate because a separation distance between the first antenna module 200 and the second antenna module 300 decreases. In order to extend the area of the at least one first ground region 161, in case that the printed circuit board 130 is extended in the third direction, the manufacturing cost of the printed circuit board 130 may increase, or a size of the printed circuit board 130 may increase. Hereinafter, as the first antenna module 200 is miniaturized, an electronic device 100 including a structure for extending the area of the at least one first ground region 161 of the first antenna module 200 will be described.

Figure 2:
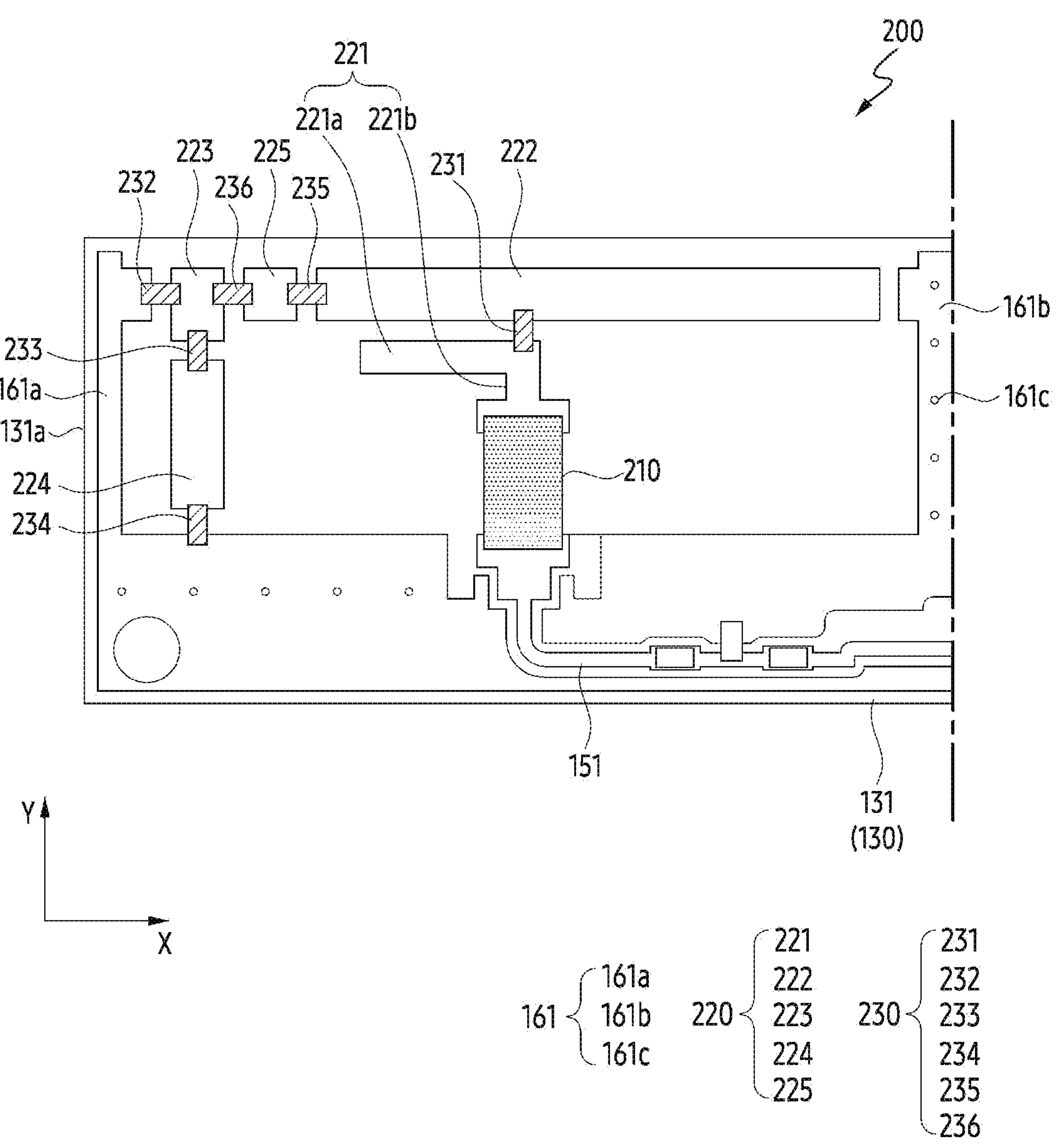
FIG. 2 is a diagram illustrating a top plan view of a first antenna module of an electronic device according to various embodiments.

FIG. 2 is a diagram illustrating a top plan view of a first antenna module of an electronic device according to various embodiments.

Referring to FIG. 2, a first antenna module 200 according to an embodiment may include a first feeding line 151, at least one first ground region 161, a first chip antenna 210, a set of first conductive patterns 220, and/or a set of first lumped elements 230.

The first chip antenna 210 may form an antenna radiator of the first antenna module 200 together with the set of first conductive patterns 220. For example, the first chip antenna 210 may include a dielectric and a conductive pattern disposed on a surface of the dielectric or inside the dielectric. According to an embodiment, the first chip antenna 210 may be disposed in a first region 131 of a printed circuit board 130. The first feeding line 151 may extend from at least one processor 140 surrounded by a shield can (e.g., the shield can 141 of FIG. 1) to an end of the first chip antenna 210. The end of the first chip antenna 210 to which the first feeding line 151 is connected may refer, for example, to a portion of the first chip antenna 210 facing a second direction (e.g., the −y direction).

According to an embodiment, the at least one first ground region 161 may surround the first chip antenna 210 and the first feeding line 151. The at least one first ground region 161 may be spaced apart from the first chip antenna 210 and the first feeding line 151. According to an embodiment, at least a portion of the at least one first ground region 161 may be disposed along at least a portion of a first periphery 131*a* of the first region 131.

According to an embodiment, the at least one first ground region 161 may include a first ground pattern 161*a*, a second ground pattern 161*b*, and via holes 161*c*. The first ground pattern 161*a* may be disposed along at least a portion of the first periphery 131*a* of the first region 131. For example, a portion of the first ground pattern 161*a* may have a first width and extend along the first periphery 131*a* of the first region 131 in the second direction. Another portion of the first ground pattern 161*a* may be connected to a portion of the first ground pattern 161*a*, have a second width greater than the first width, and extend in a first direction. The second ground pattern 161*b* may be spaced apart from the first ground pattern 161*a* in the first direction. The via holes 161*c* may be disposed in the at least one first ground region 161 and spaced apart from each other. For example, the via holes 161*c* may be disposed on a portion of the printed circuit board 130 on which at least one of the first ground pattern 161*a* and the second ground pattern 161*b* is disposed, by being spaced apart from each other. The via holes 161*c* may be electrically connected to a ground of the printed circuit board 130 by penetrating at least a portion of the printed circuit board 130.

According to an embodiment, the first feeding line 151 may extend between the first ground pattern 161*a* and the second ground pattern 161*b*. For example, the first feeding line 151 may extend between the first ground pattern 161*a* and the second ground pattern 161*b*, and may be bent at least partially toward the first chip antenna 210.

The set of first conductive patterns 220 may function as the antenna radiator of the first antenna module 200 together with the first chip antenna 210. The set of first conductive patterns 220 may include a conductive material. For example, the set of first conductive patterns 220 may be exposed by being disposed on an outer surface of the printed circuit board 130. According to an embodiment, the set of first conductive patterns 220 may include a first conductive pattern 221, a second conductive pattern 222, a third conductive pattern 223, a fourth conductive pattern 224, and a fifth conductive pattern 225, which are spaced apart from each other.

According to an embodiment, the first conductive pattern 221 may be connected to another end of the first chip antenna 210. The other end of the first chip antenna 210 may refer, for example, to a portion of the first chip antenna 210 facing a fourth direction (e.g., +y direction) opposite to the second direction. According to an embodiment, the first conductive pattern 221 may be bent at least partially in the first direction. For example, the first conductive pattern 221 may include a first portion 221*a* extending in the first direction and facing the second conductive pattern 222, and a second portion 221*b* extending in the second direction and connected to the first portion 221*a* and the other end of the first chip antenna 210. The first portion 221*a* may be parallel to a portion of the second conductive pattern 222.

According to an embodiment, the second conductive pattern 222 may be spaced apart from the first conductive pattern 221 and extend along the first direction. For example, the second conductive pattern 222 may be spaced apart from the first conductive pattern 221 in the fourth direction (e.g., +y direction) opposite to the second direction. According to an embodiment, an end of the second conductive pattern 222 may face the at least one first ground region 161. The end of the second conductive pattern 222 may refer, for example, to a portion of the second conductive pattern 222 facing the first direction. For example, the end of the second conductive pattern 222 may be spaced apart from the second ground pattern 161*b* in a third direction opposite to the first direction and face the second ground pattern 161*b*.

According to an embodiment, the third conductive pattern 223 may be disposed between the at least one first ground region 161 and the second conductive pattern 222. For example, the third conductive pattern 223 may be disposed between the first ground pattern 161*a*, which is a portion of the at least one first ground region 161, and the second conductive pattern 222, and may be spaced apart from the first ground pattern 161*a* in the first direction.

According to an embodiment, the fourth conductive pattern 224 may be disposed between the third conductive pattern 223 and the at least one first ground region 161. For example, the fourth conductive pattern 224 may be spaced apart from the third conductive pattern 223 in the second direction and extend along the second direction. According to an embodiment, the fourth conductive pattern 224 may be spaced apart from the first ground pattern 161*a*, which is a portion of the at least one first ground region 161. For example, a portion of the first ground pattern 161*a* may face the third conductive pattern 223 and the fourth conductive pattern 224, and extend in the second direction. Another portion of the first ground pattern 161*a* may face an end of the fourth conductive pattern 224 facing the second direction, and extend in the first direction.

According to an embodiment, the fifth conductive pattern 225 may be disposed between the second conductive pattern 222 and the third conductive pattern 223. For example, the fifth conductive pattern 225 may be spaced apart from the third conductive pattern 223 in the first direction.

According to an embodiment, the set of first lumped elements 230 may connect a portion of the set of first conductive patterns 220 and another portion of the set of first conductive patterns 220 to each other. For example, the set of first lumped elements 230 may electrically connect a portion of the set of first conductive patterns 220 to another portion of the set of first conductive patterns 220. For another example, the set of first lumped elements 230 may physically connect a portion of the set of first conductive patterns 220 to another portion of the set of first conductive patterns 220. According to an embodiment, the set of first lumped elements 230 may be disposed to tune the impedance and/or radiation pattern of the first antenna module 200. For example, the set of first lumped elements 230 may include a passive element configured to receive an electrical signal and not change the received signal. The passive element may include, for example, at least one of an inductor or a capacitor, but is not limited thereto.

According to an embodiment, the set of first lumped elements 230 may include a first lumped element 231, a second lumped element 232, a third lumped element 233, a fourth lumped element 234, a fifth lumped element 235, and a sixth lumped element 236. For example, the first lumped element 231 may be disposed to tune the impedance of the first antenna module 200. For another example, the second lumped element 232, the third lumped element 233, and the fourth lumped element 234 may be disposed to electrically extend a ground of the first antenna module 200.

According to an embodiment, the first lumped element 231 may connect the first conductive pattern 221 and the second conductive pattern 222. For example, the first lumped element 231 may connect the first portion 221*a* of the first conductive pattern 221 and the second conductive pattern 222. The second lumped element 232 may connect the third conductive pattern 223 and a portion of the at least one first ground region 161. For example, the second lumped element 232 may connect the first ground pattern 161*a* and the third conductive pattern 223. The third lumped element 233 may connect the third conductive pattern 223 and the fourth conductive pattern 224. The fourth lumped element 234 may connect the fourth conductive pattern 224 and another portion of the at least one first ground region 161. For example, the fourth lumped element 234 may connect the fourth conductive pattern 224 and the first ground pattern 161*a*. The fifth lumped element 235 may connect the second conductive pattern 222 and the fifth conductive pattern 225. The sixth lumped element 236 may connect the third conductive pattern 223 and the fifth conductive pattern 225.

According to an embodiment, the third conductive pattern 223, the fourth conductive pattern 224, and the at least one first ground region 161 may form a closed loop by the second lumped element 232, the third lumped element 233, and the fourth lumped element 234. For example, the third conductive pattern 223, the fourth conductive pattern 224, and the at least one first ground region 161 may form a physical or electrical closed loop by the second lumped element 232, the third lumped element 233, and the fourth lumped element 234. According to an embodiment, the first antenna module 200 may include a structure in which the ground is electrically extended through the third conductive pattern 223, the fourth conductive pattern 224, and the at least one first ground region 161 forming a closed loop by the second lumped element 232, the third lumped element 233, and the fourth lumped element 234. For example, in order for the first antenna module 200 and a second antenna module (e.g., the antenna module 300 of FIG. 1) to operate in a MIMO method, the first antenna module 200 needs to have substantially the same operating performance as the second antenna module 300. In case that an area of the at least one first ground region 161 is small, since the operation performance of the first antenna module 200 may be deteriorated compared to the operation performance of the second antenna module 300, the first antenna module 200 may require a structure in which the at least one first ground region 161 is extended. For example, in case that the first ground pattern 161*a* is directly connected to the third conductive pattern 223 and the fourth conductive pattern 224 by being extended in the first direction (e.g., +x direction), the operating performance of the first antenna module 200 may deteriorate due to a decrease in a size of the antenna radiator of the first antenna module 200. For another example, in case that the first ground pattern 161*a* is extended in the third direction opposite to the first direction since a size of the printed circuit board 130 increases, the first antenna module 200 may not be miniaturized. An electronic device (e.g., the electronic device 100 of FIG. 1) according to an embodiment may provide a structure for securing the operating performance of the first antenna module 200 while the first antenna module 200 is miniaturized by the lumped elements 232, 233, and 234 electrically connecting the conductive patterns 223 and 224 and the at least one first ground region 161.

As described above, the electronic device 100 according to an embodiment may provide the structure for securing the operation performance of the first antenna module 200 while the first antenna module 200 is miniaturized through a structure for electrically extending the ground of the first antenna module 200.

Figure 3:
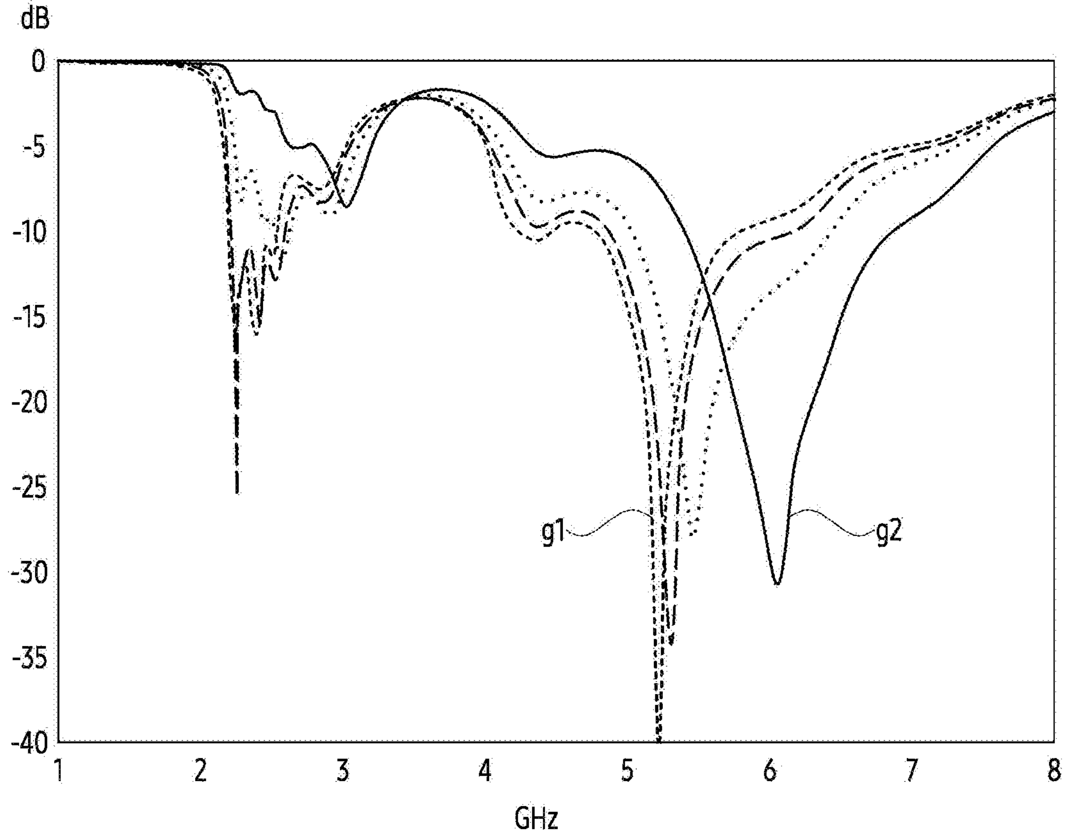
FIG. 3 is a graph representing a relationship between an impedance value of a portion of a set of first lumped elements of a first antenna module and a reflection coefficient according to various embodiments.
Figure 4:
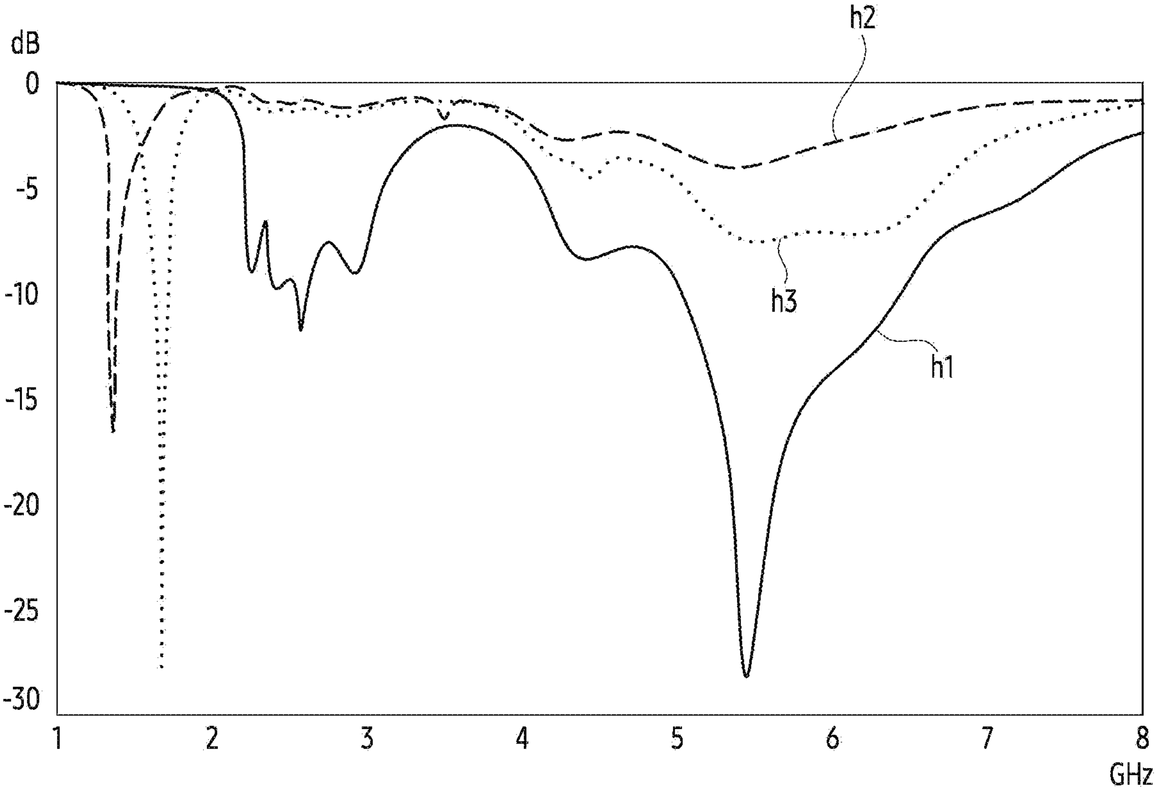
FIG. 4 is a graph representing a relationship between an impedance value of another portion of a set of first lumped elements of a first antenna module and a reflection coefficient according to various embodiments.

FIG. 3 is a graph representing a relationship between an impedance value of a portion of a set of first lumped elements of a first antenna module and a reflection coefficient according to various embodiments, and FIG. 4 is a graph representing a relationship between the impedance value of another portion of the set of first lumped elements of the first antenna module and the reflection coefficient according to various embodiments.

FIG. 3 illustrates a relationship between an impedance value of a first lumped element (e.g., the first lumped element 231 of FIG. 2) of a first antenna module (e.g., the first antenna module 200 of FIG. 1), which changes according to a change in the impedance value of the first lumped element 231, and the reflection coefficient. The reflection coefficient may refer, for example, to a ratio of the power reflected to a first feeding line (e.g., the first feeding line 151 of FIG. 1) with respect to the power input to a first antenna module 200 from the first feeding line 151. The impedance value of the first lumped element 231 may be adjusted so that the resonance of the first antenna module 200 occurs within a specific frequency band. A horizontal axis in the graph of FIG. 3 may represent a frequency, and a vertical axis in the graph of FIG. 3 may represent the reflection coefficient of the first antenna module 200. Each of the graphs of FIG. 3 represents a relationship between the frequency that appears according to the change in the impedance value of the first lumped element 231 and the reflection coefficient of the first antenna module 200.

FIG. 4 illustrates a relationship between the impedance value of the first antenna module 200, which changes according to a change in impedance values of a second lumped element (e.g., the second lumped element 232 of FIG. 2), a third lumped element (e.g., the third lumped element 233 of FIG. 2), and a fourth lumped element (e.g., the fourth lumped element 234 of FIG. 2), and the reflection coefficient. A horizontal axis in the graph of FIG. 4 may represent a frequency, and a vertical axis in the graph of FIG. 4 may represent the reflection coefficient of the first antenna module 200. Each of the graphs of FIG. 4 represents a relationship between a frequency that appears according to the change in the impedance of the second lumped element 232, the third lumped element 233, and the fourth lumped element 234, and the reflection coefficient of the first antenna module 200.

Referring to FIG. 3, it may be confirmed that the reflection coefficient and resonant frequency of the first antenna module 200 are changed according to the change of the impedance value of the first lumped element 231. For example, in case that the first lumped element 231 is a capacitor, the resonant frequency of the first antenna module 200 may move downward as the capacitance value increases. Looking at a graph g1, one of the resonant frequencies of the first antenna module 200 adjusted by the first lumped element 231 having a first capacitance value may be about 5.2 GHz. Looking at a graph g2, one of the resonant frequencies of the first antenna module 200 adjusted by the first lumped element 231 having a second capacitance value smaller than the first capacitance value may be about 6.1 GHz. Through the graphs g1 and g2, it may be confirmed that the resonant frequency of the first antenna module 200 may be adjusted by the first lumped element 231.

According to an embodiment, the impedance value of the first lumped element 231 may be set so that the first antenna module 200 operates smoothly in a first frequency band (e.g., 2.4 to 2.4835 GHz) and a second frequency band (e.g., 5.15 to 5.825 GHz). For example, the impedance value of the first lumped element 231 may be set so that the reflection coefficient of the first antenna module 200 is minimized and/or reduced in the first frequency band and the second frequency band. For another example, the impedance value of the first lumped element 231 may be set so that the first antenna module 200 has a first resonant frequency and a second resonant frequency operable in the first frequency band and the second frequency band.

Referring to FIG. 4, it may be confirmed that the reflection coefficient of the first antenna module 200 is changed according to the change of the impedance value of the second lumped element 232, the third lumped element 233, and the fourth lumped element 244. A graph h1 represents the reflection coefficient of a case in which the first antenna module 200 does not include the second lumped element 232, the third lumped element 233, and the fourth lumped element 234, and is directly connected to a third conductive pattern 223, a fourth conductive pattern 224, and a first ground pattern (e.g., the first ground pattern 161*a* of FIG. 2). A graph h2 represents the reflection coefficient of a case in which each of the third conductive pattern 223, the fourth conductive pattern 224, and the first ground pattern 161*a* is open. A graph h3 represents the reflection coefficient in a case where the impedance value of the second lumped element 232, the third lumped element 233, and the fourth lumped element 234 are specific values. According to an embodiment, the impedance value of the second lumped element 232, the third lumped element 233, and the fourth lumped element 244 may be set so that the first antenna module 200 operates smoothly in the first frequency band (e.g., 2.4 to 2.4835 GHz) and the second frequency band (e.g., 5.15 to 5.825 GHz). For example, the impedance values of the second lumped element 232, the third lumped element 233, and the fourth lumped element 244 may be set so that the reflection coefficient of the first antenna module 200 is minimized and/or reduced in the first frequency band and the second frequency band.

As described above, an electronic device (e.g., the electronic device 100 of FIG. 1) according to an embodiment may provide a structure that may efficiently establish a communication channel capable of communicating with an external electronic device in a specific frequency band by the first antenna module 200 set to have a low reflection coefficient and a specific resonant frequency in the specific frequency band according to the impedance value of the first lumped element 231. The electronic device 100 according to an embodiment may provide a structure that may efficiently establish a communication channel capable of communicating with an external electronic device in a specific frequency band by the first antenna module 200 set to have a low reflection coefficient and a specific resonant frequency in the specific frequency band according to the impedance value of the second lumped element 232, the third lumped element 233, and the fourth lumped element 234.

Figure 5:
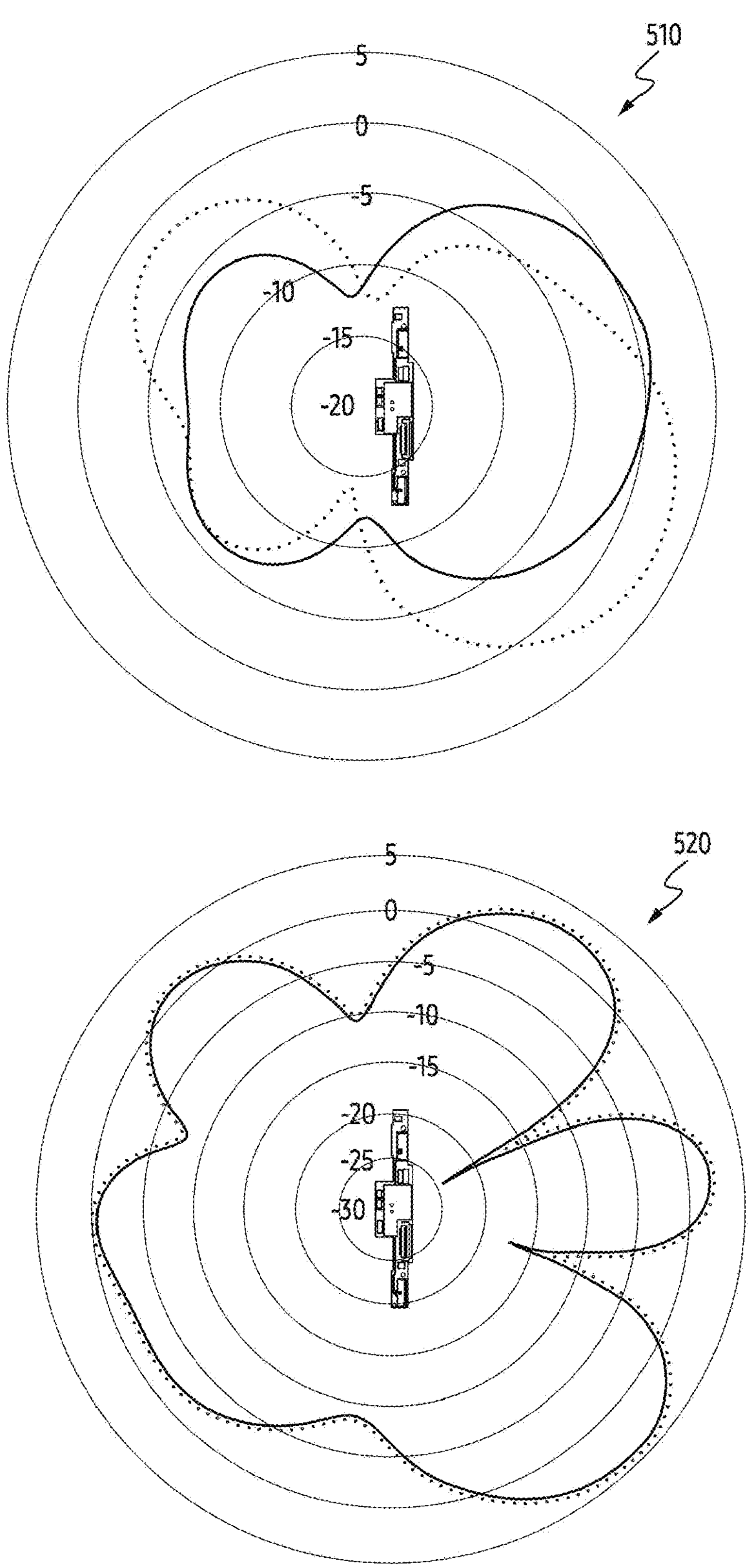
FIG. 5 includes graphs illustrating a change in a radiation pattern of a first antenna module according to an impedance value of a set of first lumped elements of the first antenna module according to various embodiments.

FIG. 5 includes graphs illustrating a change in a radiation pattern of a first antenna module and a second antenna module according to an impedance value of a set of first lumped elements of the first antenna module according to various embodiments.

FIG. 5 represents a change in a radiation pattern of a first antenna module (e.g., the first antenna module 200 of FIG. 1) and a second antenna module (e.g., the second antenna module 300 of FIG. 2) according to a change in an impedance value of a second lumped element (e.g., the second lumped element 232 of FIG. 2), a third lumped element (e.g., the third lumped element 233 of FIG. 2), and a fourth lumped element (e.g., the fourth lumped element 234 of FIG. 2). For example, FIG. 5 represent a coupled radiation pattern of the first antenna module 200 and the second antenna module 300 when the first antenna module 200 and the second antenna module 300 operate in a MIMO method.

Referring to FIG. 5, the first antenna module 200 and the second antenna module 300 according to an embodiment may operate in a 2.4 GHz bandwidth (e.g., 2.4 to 2.4835 GHz) when in a first state 510. The first antenna module 200 and the second antenna module 300 may operate in a 5 GHz bandwidth (e.g., 5.15 to 5.825 GHz) when in a second state 520. In case that the first antenna module 200 and the second antenna module 300 are in the second state 520, the radiation pattern of the first antenna module 200 and the second antenna module 300 may not change according to the change in the impedance value of the second lumped element 232, the third lumped element 233, and the fourth lumped element 234, and may be constant.

According to an embodiment, in case that the first antenna module 200 and the second antenna module 300 are in the first state 510, the radiation pattern of the first antenna module 200 and the second antenna module 300 may be changed according to the change in the impedance value of the second lumped element 232, the third lumped element 233, and the fourth lumped element 234. The impedance value of the second lumped element 232, the third lumped element 233, and the fourth lumped element 234 may be set so that the first antenna module and the second antenna module 300 have a radiation pattern that enables smooth communication between an electronic device (e.g., the electronic device 100 of FIG. 1) and an external electronic device.

As described above, the electronic device 100 according to an embodiment may change the radiation pattern of the first antenna module 200 and the second antenna module 300 by the second lumped element 232, the third lumped element 233, and the fourth lumped element 234 for electrically extending a ground of the first antenna module 200, thereby providing a structure capable of smoothly establishing a communication channel for communicating with an external electronic device.

Figure 6:
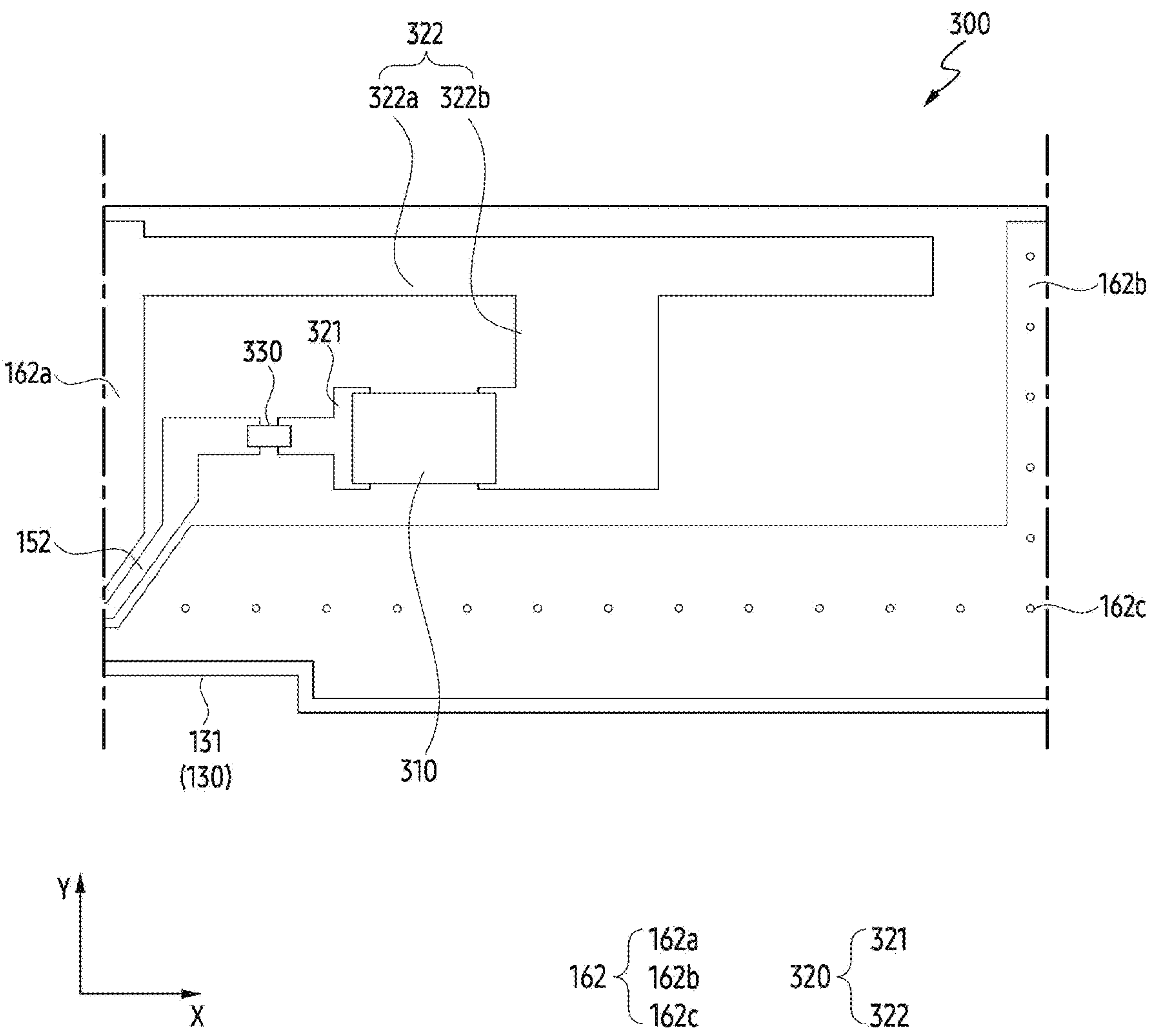
FIG. 6 is a diagram illustrating a top plan view of a second antenna module according to various embodiments.

FIG. 6 is a diagram illustrating a top plan view of a second antenna module according to various embodiments.

Referring to FIG. 6, a second antenna module 300 according to an embodiment may include a second feeding line 152, at least one second ground region 162, a second chip antenna 310, a set of second conductive patterns 320, and/or a seventh lumped element 330.

According to an embodiment, the at least one second ground region 162 may surround the second chip antenna 310 and the second feeding line 152. For example, the at least one second ground region 162 may be spaced apart from the second chip antenna 310 and the second feeding line 152. According to an embodiment, the at least one second ground region 162 may include a third ground pattern **162*a* extending in a second direction and a fourth ground pattern 162*b* spaced apart from the third ground pattern 162*a* in a first direction (e.g., +x direction). According to an embodiment, the at least one second ground region 162 may include via holes 162*c* disposed on a portion of a printed circuit board 130 on which at least one of the third ground pattern 162*a* and the fourth ground pattern 162*b* is disposed, and spaced apart from each other. The via holes 162*c* may be electrically connected to a ground of the printed circuit board 130 by penetrating at least a portion of the printed circuit board 130. According to an embodiment, the fourth ground pattern 162*b*** may have a shape in which at least a portion is bent with respect to the first direction.

According to an embodiment, the second feeding line 152 may extend from at least one processor 140 that is surrounded by a shield can (e.g., the shield can 141 of FIG. 1). According to an embodiment, the second feeding line 152 may extend between a portion of the at least one second ground region 162 and another portion of the at least one second ground region 162. For example, the second feeding line 152 may extend between the third ground pattern **162*a*, which is a portion of the at least one second ground region 162, and the fourth ground pattern 162*b*, which is another portion of the at least one second ground region 162. According to an embodiment, the second feeding line 152** may extend in a direction inclined with respect to the first direction.

The second chip antenna 310 may form an antenna radiator of the second antenna module 300 together with the set of second conductive patterns 320. For example, the second chip antenna 310 may include a dielectric, and a conductive pattern disposed on a surface of the dielectric or inside the dielectric. According to an embodiment, the second chip antenna 310 may be disposed in a first region 131 of the printed circuit board 130. For example, the second chip antenna 310 may be spaced apart from a first antenna module (e.g., the first antenna module 200 of FIG. 1) in the first direction. According to an embodiment, the second chip antenna 310 may be spaced apart from the second feeding line 152. For example, the second chip antenna 310 may be spaced apart from the second feeding line 152 in the first direction.

The set of second conductive patterns 320 may function as the antenna radiator of the second antenna module 300 together with the second chip antenna 310. The set of second conductive patterns 320 may include a conductive material. For example, the set of second conductive patterns 320 may be exposed by being disposed on an outer surface of the printed circuit board 130. According to an embodiment, the set of second conductive patterns 320 may include a sixth conductive pattern 321 and a seventh conductive pattern 322 spaced apart from each other.

According to an embodiment, the sixth conductive pattern 321 may be spaced apart from the second feeding line 152 and connected to an end of the second chip antenna 310. For example, the sixth conductive pattern 321 may be spaced apart from the second feeding line 152 in the first direction. The end of the second chip antenna 310 to which the sixth conductive pattern 321 is connected may be a portion of the second chip antenna 310 facing a third direction (e.g., −x direction) opposite to the first direction.

According to an embodiment, the seventh conductive pattern 322 may be connected to another end of the second chip antenna 310 and a portion of the at least one second ground region 162. The other end of the second chip antenna 310 may be a portion of the second chip antenna 310 facing the first direction. For example, the seventh conductive pattern 322 may be connected to the third ground pattern **162*a*, which is a portion of the at least one second ground region 162. According to an embodiment, the seventh conductive pattern 322 may be spaced apart from another portion of the at least one second ground region 162. For example, the seventh conductive pattern 322 may be spaced apart from the fourth ground pattern 162*b*, which is the other portion of the at least one second ground region 162**, in the third direction opposite to the first direction.

According to an embodiment, the seventh conductive pattern 322 may include a third portion **322*a* extending from a portion of the at least one second ground region 162, and a fourth portion 322***b* that is partially connected to the other end of the second chip antenna 310 by being extended from the third portion 322*a*. For example, the third portion 322*a* may extend in the first direction from the third ground pattern 162*a*, which is a portion of the at least one second ground region 162. According to an embodiment, the third portion 322*a* may be spaced apart from the fourth ground pattern 162*b*, which is another portion of the at least one second ground region 162. For example, an end of the third portion 322*a* facing the first direction may be spaced apart from the fourth ground pattern 162*b* and face the fourth ground pattern 162*b*. According to an embodiment, the fourth portion 322*b* may extend from the third portion 322*a* in the second direction (e.g., −y direction).

The seventh lumped element 330 may be disposed to tune the impedance and/or radiation pattern of the second antenna module 300. For example, the seventh lumped element 330 may include a passive element configured to receive an electrical signal and not change the received signal. The passive element may include, for example, at least one of an inductor or a capacitor, but is not limited thereto. According to an embodiment, the seventh lumped element 330 may connect the second feeding line 152 and the sixth conductive pattern 321.

As described above, an electronic device (e.g., the electronic device 100 of FIG. 1) according to an embodiment may provide a structure capable of efficient communication with an external electronic device by the second antenna module 300 capable of communicating in a MIMO method together with a first antenna module (e.g., the antenna module 200 of FIG. 1).

Figure 7:
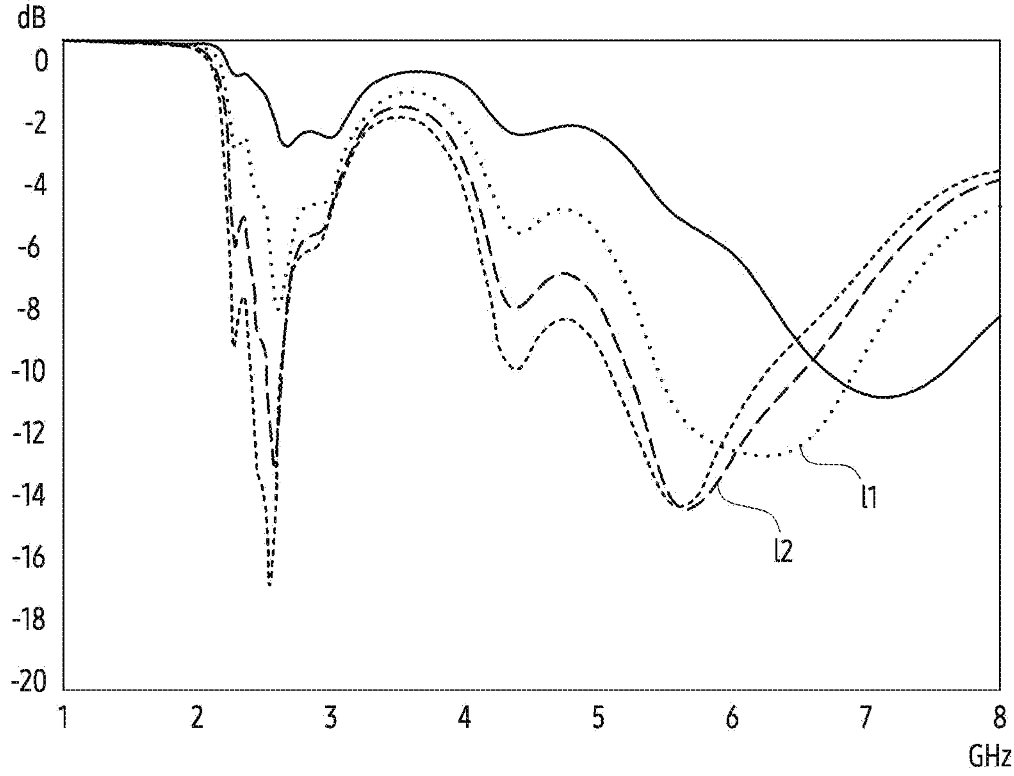
FIG. 7 is a graph representing a relationship between an impedance value of a lumped element of a second antenna module and a reflection coefficient according to various embodiments.

FIG. 7 is a graph representing a relationship between an impedance value of a lumped element of a second antenna module and a reflection coefficient according to various embodiments.

FIG. 7 represents a relationship between an impedance value of a second antenna module (e.g., the second antenna module 300 of FIG. 1) that changes according to a change in an impedance value of a seventh lumped element (e.g., the seventh lumped element 330 of FIG. 6) and a reflection coefficient. The reflection coefficient may refer, for example, to a ratio of a voltage reflected to a second feeding line (e.g., the second feeding line 152 of FIG. 6) with respect to a voltage input to the second antenna module 300 from the second feeding line 152. The impedance value of the seventh lumped element 330 may be adjusted so that the resonance of the second antenna module 200 occurs within a specific frequency band. A horizontal axis in the graph of FIG. 7 may represent a frequency, and a vertical axis in the graph of FIG. 7 may represent the reflection coefficient of the second antenna module 300. Each of the graphs of FIG. 7 represents a relationship between a frequency that appears according to the change of the impedance value of the seventh lumped element 330 and the reflection coefficient of the second antenna module 300.

Referring to FIG. 7, it may be confirmed that the reflection coefficient and resonant frequency of the second antenna module 300 are changed according to the change of the impedance value of the seventh lumped element 330. For example, in case that the seventh lumped element 330 is a capacitor, as the capacitance value increases, the resonant frequency of the second antenna module 300 may move downward. Looking at a graph 11, one of the resonant frequencies of the second antenna module 300 adjusted by the seventh lumped element 330 having a third capacitance value may be about 6.2 GHz. Looking at a graph 12, one of the resonant frequencies of the second antenna module 300 adjusted by the seventh lumped element 330 having a fourth capacitance value smaller than the third capacitance may be about 5.6 GHz. Through the graphs 11 and 12, it may be confirmed that the resonant frequency of the second antenna module 300 may be adjusted by the seventh lumped element 330.

According to an embodiment, the impedance value of the seventh lumped element 330 may be set so that the second antenna module 300 operates smoothly in a first frequency band (e.g., 2.4 to 2.4835 GHz) and a second frequency band (e.g., 5.15 to 5.825 GHz). For example, the impedance value of the seventh lumped element 330 may be set so that the reflection coefficient of the second antenna module 300 is minimized and/or reduced in the first frequency band and the second frequency band. For another example, the impedance value of the seventh lumped element 330 may be set so that the second antenna module 300 has a first resonant frequency and a second resonant frequency capable of operating in the first frequency band and the second frequency band.

As described above, an electronic device (e.g., the electronic device 100 of FIG. 1) according to an embodiment may provide a structure that may efficiently establish a communication channel capable of communicating with an external electronic device in a specific frequency band by the second antenna module 300 set to have a low reflection coefficient and a specific resonant frequency in the specific frequency band by the seventh lumped element 330.

Figure 8:
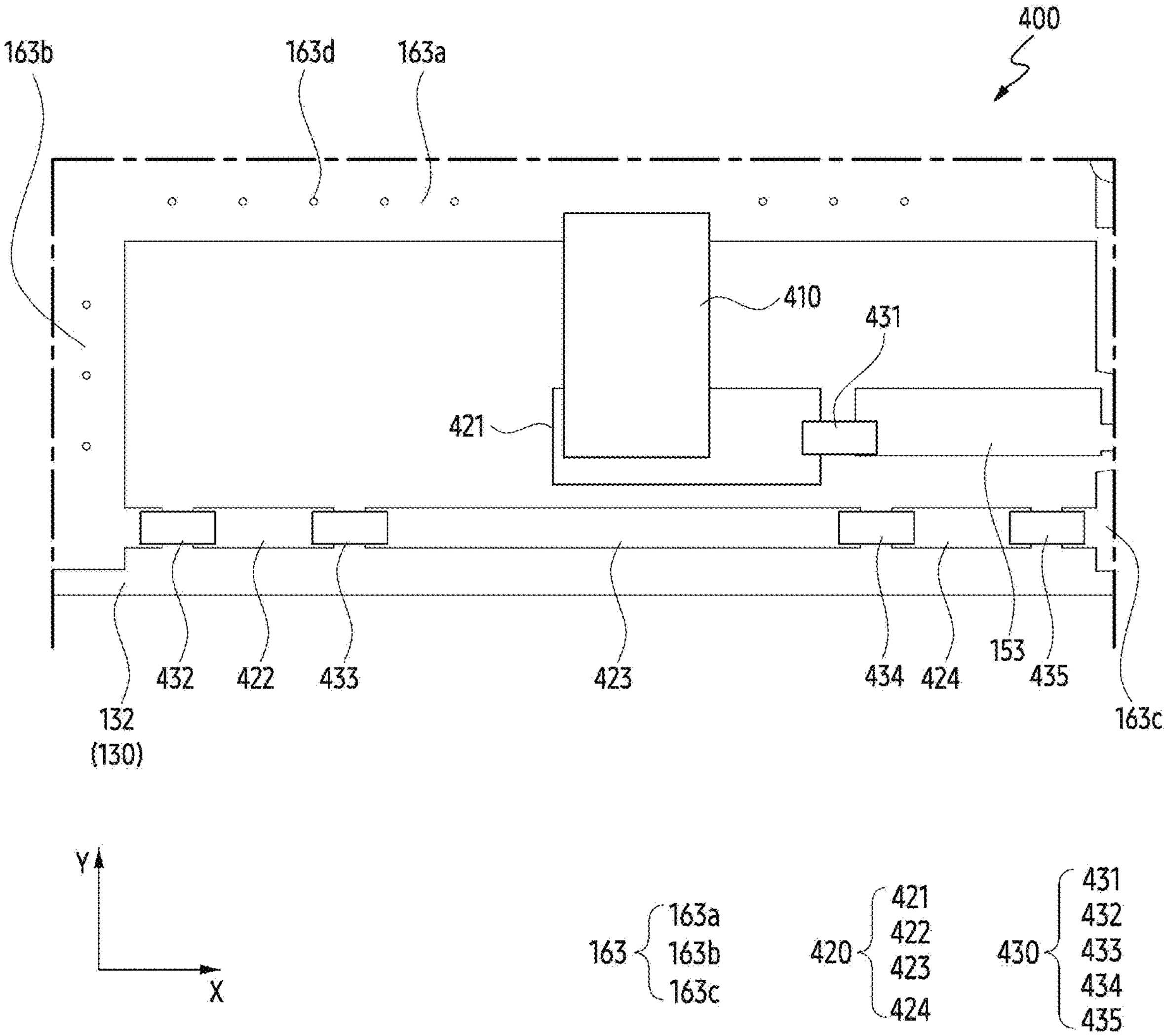
FIG. 8 is a diagram illustrating a top plan view of a Bluetooth module according to various embodiments.

FIG. 8 is a diagram illustrating a top plan view of a Bluetooth module according to various embodiments.

Referring to FIG. 8, a Bluetooth module 400 according to an embodiment may include a third feeding line 153, at least one third ground region 163, a third chip antenna 410, a set of third conductive patterns 420, and/or a set of second lumped elements 430.

According to an embodiment, the at least one third ground region 163 may surround the third chip antenna 410 and the third feeding line 153. The at least one third ground region 163 may be spaced apart from the third chip antenna 410 and the third feeding line 153. According to an embodiment, the at least one third ground region 163 may include a fifth ground pattern 163*a* extending in a first direction (e.g., +x direction), a sixth ground pattern 163*b* vertically connected to the fifth ground pattern 163*a* and extending in a second direction (e.g., −y direction), and a seventh ground pattern 163*c* spaced apart from the sixth ground pattern 163*b* in the first direction. According to an embodiment, the at least one third ground region 163 may include via holes 163*d* disposed on a portion of a printed circuit board 130 on which at least one among the fifth ground pattern 163*a*, the sixth ground pattern 163*b*, and the seventh ground pattern 163*c* is disposed, and spaced apart from each other. The via holes 163*d* may be electrically connected to a ground of the printed circuit board 130 by penetrating at least a portion of the printed circuit board 130.

According to an embodiment, the third feeding line 153 may extend from at least one processor 140 surrounded by a shield can (e.g., the shield can 141 of FIG. 1) to a second region 132 of the printed circuit board 130. According to an embodiment, the third feeding line 153 may be spaced apart from the at least one third ground region 163. For example, the third feeding line 153 may be parallel to the fifth ground pattern 163*a*. According to an embodiment, the third feeding line 153 may be spaced apart from the third chip antenna 410 in the first direction.

The third chip antenna 410 may form an antenna radiator of the Bluetooth module 400 together with the set of third conductive patterns 420. For example, the third chip antenna 410 may include a dielectric, and a conductive pattern disposed on a surface of the dielectric or inside the dielectric. According to an embodiment, the third chip antenna 410 may be disposed in the second region 132 of the printed circuit board 130. According to an embodiment, the third chip antenna 410 may be connected to the at least one third ground region 163. For example, an end of the third chip antenna 410 facing a fourth direction (e.g., +y direction) opposite to the second direction may be connected to the fifth ground pattern 163*a*.

The set of third conductive patterns 420 may function as the antenna radiator of the Bluetooth module 400 together with the third chip antenna 410. The set of third conductive patterns 420 may include a conductive material. For example, the set of third conductive patterns 420 may be exposed by being disposed on an outer surface of the printed circuit board 130. According to an embodiment, the set of third conductive patterns 420 may include an eighth conductive pattern 421, a ninth conductive pattern 422, a tenth conductive pattern 423, and an eleventh conductive pattern 424.

According to an embodiment, the eighth conductive pattern 421 may be in contact with another end of the third chip antenna 410 and may be spaced apart from the third feeding line 153. The other end of the third chip antenna 410 in contact with the eighth conductive pattern 421 may be a portion of the third chip antenna 410 facing the second direction. The eighth conductive pattern 421 may be spaced apart from the third feeding line 153 in a third direction opposite to the first direction.

According to an embodiment, the ninth conductive pattern 422 may be disposed between a portion of the at least one third ground region 163 and another portion of the at least one third ground region 163. For example, the ninth conductive pattern 422 may be disposed between the sixth ground pattern 163*b* and the seventh ground pattern 163*c*, which are a portion of the at least one third ground region 163. According to an embodiment, the ninth conductive pattern 422 may be spaced apart from the sixth ground pattern 163*b* in the first direction.

According to an embodiment, the tenth conductive pattern 423 may be disposed between the ninth conductive pattern 422 and the seventh ground pattern 163*c*. For example, the tenth conductive pattern 423 may be spaced apart from the ninth conductive pattern 422 in the first direction.

According to an embodiment, the eleventh conductive pattern 424 may be disposed between the tenth conductive pattern 423 and the seventh ground pattern 163*c*. For example, the eleventh conductive pattern 424 may be spaced apart from the tenth conductive pattern 423 in the first direction.

The set of second lumped elements 430 may connect a portion of the set of third conductive patterns 420 and another portion of the set of third conductive patterns 420 to each other. For example, the set of second lumped elements 430 may electrically connect a portion of the set of third conductive patterns 420 and another portion of the set of third conductive patterns 420. For another example, the set of second lumped elements 430 may physically connect a portion of the set of third conductive patterns 420 and another portion of the set of third conductive patterns 420. According to an embodiment, the set of second lumped elements 430 may be disposed to tune the impedance and/or radiation pattern of the Bluetooth module 400. The set of second lumped elements 430 may include a passive element configured to receive an electrical signal and not change the received signal. The passive element may include, for example, at least one of an inductor or a capacitor, but is not limited thereto.

According to an embodiment, the set of second lumped elements 430 may include an eighth lumped element 431, a ninth lumped element 432, a tenth lumped element 433, an eleventh lumped element 434, and a twelfth lumped element 435. For example, the eighth lumped element 431 may be disposed to tune the antenna impedance of the Bluetooth module 400. For another example, the ninth lumped element 432, the tenth lumped element 433, the eleventh lumped element 434, and the twelfth lumped element 435 may be disposed to tune the radiation pattern of the Bluetooth module 400. For example, the ninth lumped element 432, the tenth lumped element 433, the eleventh lumped element 434, and the twelfth lumped element 435 may tune the radiation pattern of the Bluetooth module 400 so that the radiation pattern of the Bluetooth module 400 is directed toward a surface (e.g., the surface 110*a* of FIG. 1) of a housing (e.g., the housing 110 of FIG. 1).

According to an embodiment, the eighth lumped element 431 may connect the third feeding line 153 and the eighth conductive pattern 421. According to an embodiment, the ninth lumped element 432 may connect a portion of the at least one third ground region 163 and the ninth conductive pattern 422. For example, the ninth lumped element 432 may connect the sixth ground pattern 163*b*, which is a portion of the at least one third ground region 163, and the ninth conductive pattern 422. According to an embodiment, the tenth lumped element 433 may connect the ninth conductive pattern 422 and the tenth conductive pattern 423. The eleventh lumped element 434 may connect the tenth conductive pattern 423 and the eleventh conductive pattern 424. According to an embodiment, the twelfth lumped element 435 may connect the eleventh conductive pattern 424 and another portion of the at least one third ground region 163. For example, the twelfth lumped element 435 may connect the seventh ground pattern 163*c*, which is another portion of the at least one third ground region 163, and the eleventh conductive pattern 424.

As described above, an electronic device (e.g., the electronic device 100 of FIG. 1) according to an embodiment may provide a structure capable of establishing a communication channel for short-range communication with an external electronic device by the Bluetooth module 400 spaced apart from a first antenna module (e.g., the first antenna module 200 of FIG. 1) and a second antenna module (e.g., the second antenna module 300 of FIG. 1).

Figure 9:
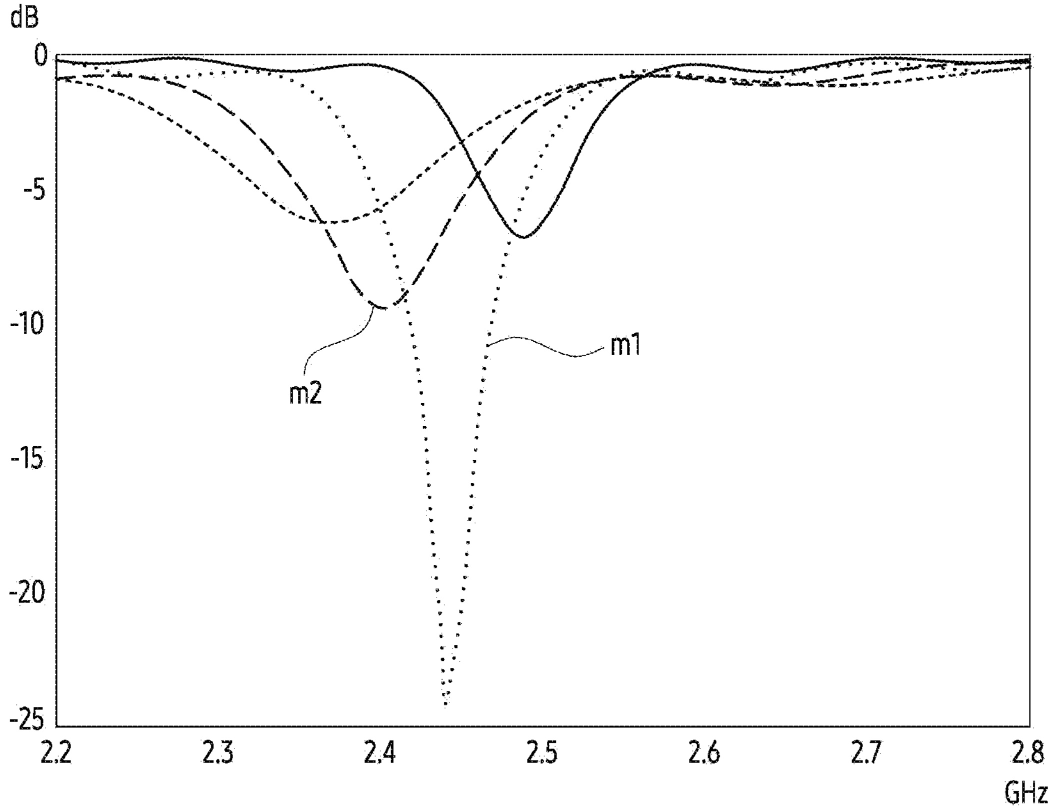
FIG. 9 is a graph representing a relationship between an impedance value of a portion of a set of second lumped elements of a third antenna module and a reflection coefficient according to various embodiments.

FIG. 9 is a graph representing a relationship between an impedance value of a portion of a set of second lumped elements of a third antenna module and a reflection coefficient according to various embodiments.

FIG. 9 represents a relationship between an impedance value of a Bluetooth module (e.g., the Bluetooth module 400 of FIG. 1) that changes according to a change in an impedance value of an eighth lumped element (e.g., the eighth lumped element 431 of FIG. 8) and the reflection coefficient. The reflection coefficient may refer, for example, to a ratio of a voltage reflected to a third feeding line (e.g., the third feeding line 153 of FIG. 8) with respect to a voltage input to the Bluetooth module 400 from the third feeding line 153. The impedance value of the eighth lumped element 431 may be adjusted so that the resonance of the Bluetooth module 400 occurs within a specific frequency band. A horizontal axis in the graph of FIG. 9 may represent a frequency, and a vertical axis in the graph of FIG. 9 may represent the reflection coefficient of the Bluetooth module 400. Each of the graphs of FIG. 9 represents a relationship between a frequency that appears according to the change in the impedance value of the eighth lumped element 431 and the reflection coefficient of the Bluetooth module 400.

Referring to FIG. 9, it may be confirmed that the reflection coefficient of the Bluetooth module 400 is changed according to the change of the impedance value of the eighth lumped element 431. For example, in case that the eighth lumped element 431 is a capacitor, the capacitance of the Bluetooth module 400 may move downward as the capacitance value increases. Looking at a graph m1, one of the resonant frequencies of the Bluetooth module 400 adjusted by the eighth lumped element 431 having a fifth capacitance value may be about 2.45 GHz. Looking at a graph m2, one of the resonant frequencies of the Bluetooth module 400 adjusted by the eighth lumped element 431 having a sixth capacitance value smaller than the fifth capacitance value may be about 2.4 GHz. Through the graphs m1 and m2, it may be confirmed that the resonant frequency of the Bluetooth module 400 may be adjusted by the eighth lumped element 431.

According to an embodiment, the impedance value of the eighth lumped element 431 may be set so that the Bluetooth module 400 operates smoothly in a second frequency band (e.g., 2.4 to 2.4835 GHz). For example, the impedance value of the eighth lumped element 431 may be set so that the reflection coefficient of the Bluetooth module 400 in the second frequency band is minimized. For another example, the impedance value of the eighth lumped element 431 may be set so that the Bluetooth module 400 has a second resonant frequency operable in the second frequency band.

As described above, an electronic device (e.g., the electronic device 100 of FIG. 1) according to an embodiment may provide a structure that can efficiently establish a communication channel capable of short-range communication with an external electronic device in a specific frequency band by the Bluetooth module 400 set to have a low reflection coefficient and a specific resonant frequency in the specific frequency band according to the impedance value of the eighth lumped element 431.

An electronic device (e.g., the electronic device 100 of FIG. 1) according to an example embodiment may comprise: a printed circuit board (e.g., the printed circuit board 130 of FIG. 1) including a first region (e.g., the first region 131 of FIG. 1) extending in a first direction, and a second region (e.g., the second region 132 of FIG. 1) extending in a second direction perpendicular to the first region, a first antenna module comprising at least one antenna (e.g., the first antenna module 200 of FIG. 1) disposed on the first region, a second antenna module comprising at least one antenna (e.g., the second antenna module 300 of FIG. 1) spaced apart from the first antenna module in the first direction and disposed on the first region, a Bluetooth module comprising circuitry (e.g., the Bluetooth module 400 of FIG. 1) disposed on the second region, and at least one processor, comprising processing circuitry (e.g., the at least one processor 140 of FIG. 1), electrically connected to the first antenna module, the second antenna module, and the Bluetooth module. According to an example embodiment, the first antenna module may comprise a chip antenna (e.g., the first chip antenna 210 of FIG. 2), a feeding line (e.g., the first feeding line 151 of FIG. 2) extending from the at least one processor to an end of the chip antenna, at least one first ground region (e.g., the at least one first ground region 160 of FIG. 2) surrounding the chip antenna, the feeding line, and at least a portion of a periphery of the first region. According to an example embodiment, the first antenna module may include a set of first conductive patterns (e.g., the set of first conductive patterns 220 of FIG. 2) including a first conductive pattern (e.g., the first conductive pattern 221 of FIG. 2) in contact with another end of the chip antenna, a second conductive pattern (e.g., the second conductive pattern 222 of FIG. 2) spaced apart from the first conductive pattern and extending in the first direction, a third conductive pattern (e.g., the third conductive pattern 223 of FIG. 2) disposed between the second conductive pattern and the at least one first ground region, and a fourth conductive pattern (e.g., the fourth conductive pattern 224 of FIG. 2) disposed between the third conductive pattern and the at least one first ground region. According to an example embodiment, the first antenna module may include a set of first lumped elements comprising a conductive material (e.g., the set of first lumped elements 230 of FIG. 1) including a first lumped element (e.g., the first lumped element 231 of FIG. 2) in contact with the first conductive pattern and the second conductive pattern, a second lumped element (e.g., the second lumped element 232 of FIG. 2) in contact with the third conductive pattern and a portion of the at least one first ground region, a third lumped element (e.g., the third lumped element 233 of FIG. 2) in contact with the third conductive pattern and the fourth conductive pattern, and a fourth lumped element (e.g., the fourth lumped element 234 of FIG. 4) in contact with the fourth conductive pattern and another portion of the at least one first ground region different from the portion of the at least one first ground region. According to an example embodiment, the third conductive pattern, the fourth conductive pattern, and the at least one first ground region may form a closed loop by the second lumped element, the third lumped element, and the fourth lumped element.

According to an example embodiment, the portion of the at least one first ground region may face the third conductive pattern and the fourth conductive pattern and extend to be parallel to the third conductive pattern and the fourth conductive pattern. According to an example embodiment, the other portion of the at least one first ground region may face an end of the fourth conductive pattern facing the second direction and extend perpendicular to the portion of the at least one first ground region.

According to an example embodiment, the set of first conductive patterns may further include a fifth conductive pattern (e.g., the fifth conductive pattern 225 of FIG. 2) disposed between the second conductive pattern and the third conductive pattern. According to an example embodiment, the set of first lumped elements may further include a fifth lumped element (e.g., the fifth lumped element 235 of FIG. 2) in contact with the second conductive pattern and the fifth conductive pattern, and a sixth lumped element (e.g., the sixth lumped element 236 of FIG. 2) connecting the third conductive pattern and the fifth conductive pattern.

According to an example embodiment, the first conductive pattern may include a first portion (e.g., the first portion 221*a* of FIG. 2) parallel to the second conductive pattern and facing the second conductive pattern, and a second portion (e.g., the second portion 221*b* of FIG. 2) vertically connected to the first portion and connected to the other end of the chip antenna. According to an example embodiment, the first lumped element may contact the first portion and the second conductive pattern.

According to an example embodiment, the fourth conductive pattern may be spaced apart from the third conductive pattern in the second direction.

According to an example embodiment, the second antenna module may include a second feeding line (e.g., the second feeding line 152 of FIG. 6), different from a first feeding line which is the feeding line, spaced apart from the first feeding line in the first direction, a second chip antenna (e.g., the second chip antenna 310 of FIG. 6), different from a first chip antenna which is the chip antenna, facing the second feeding line, and at least one second ground region (e.g., the at least one second ground region 162 of FIG. 6), different from the at least one first ground region, surrounding the second chip antenna and the second feeding line. According to an example embodiment, the second antenna module may include a set of second conductive patterns (e.g., the set of second conductive patterns 320 of FIG. 6), different from the set of first conductive patterns, and including a sixth conductive pattern (e.g., the sixth conductive pattern 321 of FIG. 6) facing the second feeding line and is connected to an end of the second chip antenna, and a seventh conductive pattern (e.g., the seventh conductive pattern 327 of FIG. 6) that contacts another end of the second chip antenna and a portion of the at least one second ground region, spaced apart from another portion of the at least one second ground region different from the portion of the at least one second ground region. According to an example embodiment, the second antenna module may include a seventh lumped element (e.g., the seventh lumped element 330 of FIG. 6) in contact with the second feeding line and the sixth conductive pattern.

According to an example embodiment, the seventh conductive pattern may include a third portion (e.g., the third portion 322*a* of FIG. 6) extending from the portion of the at least one second ground region in the first direction, an end of the third portion spaced apart from the other portion of the at least one second ground region, and a fourth portion (e.g., the fourth portion 322*b* of FIG. 6) extending from the third portion in the second direction, a portion of the fourth portion connected to the other end of the second chip antenna.

According to an example embodiment, a portion of the second feeding line may extend in a direction distinct from the first direction between the portion of the at least one second ground region and the other portion of the at least one second ground region.

According to an example embodiment, an area of the at least one second ground region may be greater than an area of the at least one first ground region.

According to an example embodiment, the Bluetooth module may include a third chip antenna (e.g., the third chip antenna 410 of FIG. 8), different from a first chip antenna which is the chip antenna, disposed on the second region, a third feeding line (e.g., the third feeding line 153 of FIG. 8), different from a first feeding line which is the feeding line, spaced apart from the third chip antenna in the first direction, and at least one third ground region (e.g., the third ground region 163 of FIG. 8), different from the at least one first ground region, surrounding the third chip antenna and the third feeding line. According to an example embodiment, the Bluetooth module may include a set of third conductive patterns (e.g., the set of third conductive patterns 420 of FIG. 8), different from the set of first conductive patterns, the set of third conductive patterns including an eighth conductive pattern (e.g., the eighth conductive pattern 421 of FIG. 8), contacted with another end of the third chip antenna, spaced apart from the third feeding line, and a ninth conductive pattern (e.g., the ninth conductive pattern 422 of FIG. 8) disposed between a portion of the at least one third ground region and another portion of the at least one third ground region. According to an example embodiment, the Bluetooth module may include a set of second lumped elements (e.g., the set of second lumped elements 430 of FIG. 8), different from the set of first lumped elements, the set of second lumped elements including an eighth lumped element (e.g., the eighth lumped element 431 of FIG. 8) connecting the third feeding line and the eighth conductive pattern, and a ninth lumped element (e.g., the ninth lumped element 432 of FIG. 8) connecting the portion of the at least one third ground region and the ninth conductive pattern.

According to an example embodiment, the set of third conductive patterns may include a tenth conductive pattern (e.g., the tenth conductive pattern 423 of FIG. 8) spaced apart from the ninth conductive pattern in the first direction, and an eleventh conductive pattern (e.g., the eleventh conductive pattern 424 of FIG. 8) disposed between the tenth conductive pattern and the other portion of the at least one third ground region. According to an example embodiment, the set of second lumped elements may include a tenth lumped element (e.g., the tenth lumped element 433 of FIG. 8) in contact with the ninth conductive pattern and the tenth conductive pattern, an eleventh lumped element (e.g., the eleventh lumped element 434 of FIG. 8) in contact with the tenth conductive pattern and the eleventh conductive pattern, and a twelfth lumped element (e.g., the twelfth lumped element 435 of FIG. 8) in contact with the eleventh conductive pattern and the other portion of the at least one third ground region.

According to an example embodiment, the second region may be spaced apart from both peripheries (e.g., the both peripheries 131*a* and 131*b* of the first region 131 of FIG. 1) of the first region.

According to an example embodiment, the electronic device may comprise a first microphone (e.g., the first microphone 170 of FIG. 1) spaced apart from the first antenna module in the first direction. According to an example embodiment, the electronic device may further comprise a second microphone (e.g., the second microphone 180 of FIG. 1), spaced apart from the first microphone in the first direction, disposed on another periphery of the first region facing the first direction.

According to an example embodiment, the electronic device may further comprise a shield can (e.g., the shield can 141 of FIG. 1), disposed over the at least one processor to shield the at least one processor. According to an example embodiment, the at least one processor and the shield may be disposed between the first antenna module, the second antenna module, and the Bluetooth module.

According to an example embodiment, the electronic device may further comprise a connector (e.g., the connector 190 of FIG. 1), disposed between the first antenna module and the second antenna module, to electrically connect the PCB to another PCB.

According to an example embodiment, the electronic device may further comprise a plurality of via holes (e.g., the via holes 161*c* of FIG. 2) disposed in the at least one first ground region, penetrating at least a portion of the PCB, and spaced apart from each other.

An antenna module (e.g., the first antenna module 200 of FIG. 1) according to an example embodiment may comprise: a printed circuit board (e.g., the printed circuit board 130 of FIG. 1), a chip antenna (e.g., the first chip antenna 210 of FIG. 2) disposed on the printed circuit board, a feeding line (e.g., the first feeding line 151 of FIG. 2) connected to an end of the chip antenna, at least one first ground region (e.g., the at least one first ground region 160 of FIG. 2) surrounding the chip antenna and the feeding line and disposed along a portion of a periphery of the printed circuit board, a set of first conductive patterns including a first conductive pattern (e.g., the first conductive pattern 221 of FIG. 2) connected to another end of the chip antenna, a second conductive pattern (e.g., the second conductive pattern 222 of FIG. 2) spaced apart from the first conductive pattern and extending in a first direction, a third conductive pattern (e.g., the third conductive pattern 223 of FIG. 2) disposed between the portion of the at least one first ground region and another end of the second conductive pattern, and a fourth conductive pattern (e.g., the fourth conductive pattern 224 of FIG. 2) spaced apart from the third conductive pattern and extending in a second direction perpendicular to the first direction, and a set of first lumped elements comprising a conductive material (e.g., the set of first lumped elements 230 of FIG. 1) including a first lumped element (e.g., the first lumped element 231 of FIG. 2) connecting the first conductive pattern and the second conductive pattern, a second lumped element (e.g., the second lumped element 232 of FIG. 2) connecting the third conductive pattern and the portion of the at least one first ground region, a third lumped element (e.g., the third lumped element 233 of FIG. 2) connecting the third conductive pattern and the fourth conductive pattern, and a fourth lumped element (e.g., the fourth lumped element 234 of FIG. 4) connecting the fourth conductive pattern and another portion of the at least one first ground region, wherein the third conductive pattern, the fourth conductive pattern, and the at least one first ground region may form a closed loop by the second lumped element, the third lumped element, and the fourth lumped element.

According to an example embodiment, the portion of the at least one first ground region may face the third conductive pattern and the fourth conductive pattern and extend in the second direction. According to an example embodiment, the other portion of the at least one first ground region may face an end of the fourth conductive pattern facing the second direction and extend along the first direction.

According to an example embodiment, the set of first conductive patterns may further include a fifth conductive pattern (e.g., the fifth conductive pattern 225 of FIG. 2) disposed between the second conductive pattern and the third conductive pattern. According to an example embodiment, the set of first lumped elements may further include a fifth lumped element (e.g., the fifth lumped element 235 of FIG. 2) connecting the second conductive pattern and the fifth conductive pattern and a sixth lumped element (e.g., the sixth lumped element 236 of FIG. 2) connecting the third conductive pattern and the fifth conductive pattern.

According to an example embodiment, the first conductive pattern may include a first portion (e.g., the first portion 221*a* of FIG. 2) extending in the first direction and facing the second conductive pattern, and a second portion (e.g., the second portion 221*b* of FIG. 2) extending in the second direction and connected to the first portion and the other end of the chip antenna. According to an example embodiment, the first lumped element may connect the first portion and the second conductive pattern.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things unless the relevant context clearly indicates otherwise. As used herein, each of such phrases as “A or B,” “at least one of A and B,” “at least one of A or B,” “A, B, or C,” “at least one of A, B, and C,” and “at least one of A, B, or C,” may include any one of or all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” or “connected with” another element (e.g., a second element), the element may be coupled with the other element directly (e.g., wiredly), wirelessly, or via a third element.

As used in connection with various embodiments of the disclosure, the term “module” may include a unit implemented in hardware, software, or firmware, or any combination thereof, and may interchangeably be used with other terms, for example, “logic,” “logic block,” “part,” or “circuitry”. A module may be a single integral component, or a minimum unit or part thereof, adapted to perform one or more functions. For example, according to an embodiment, the module may be implemented in a form of an application-specific integrated circuit (ASIC).

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer’s server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

No claim element is to be construed under the provisions of 35 U.S.C. § 112, sixth paragraph, unless the element is expressly recited using the phrase "means for" or "means."

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a printed circuit board (PCB) including:

a first region extending in a first direction, and a second region extending in a second direction perpendicular to the first direction;

a first antenna module including at least one antenna disposed on the first region;

a second antenna module including at least one antenna spaced apart from the first antenna module in the first direction and disposed on the first region;

a Bluetooth module comprising circuitry disposed on the second region; and at least one processor, comprising processing circuitry, operatively coupled to the first antenna module, the second antenna module, and the Bluetooth module, wherein the first antenna module comprises:

a chip antenna, a feeding line extending from the at least one processor to an end of the chip antenna, at least one first ground region surrounding the chip antenna and the feeding line, at least portion of the at least one first ground region disposed along at least a portion of a periphery of the first region, a set of first conductive patterns including:

a first conductive pattern connected to another end of the chip antenna, a second conductive pattern spaced apart from the first conductive pattern and extending in the first direction, a third conductive pattern disposed between the second conductive pattern and the at least one first ground region, a fourth conductive pattern disposed between the third conductive pattern and the at least one first ground region, and a fifth conductive pattern disposed between the second conductive pattern and the third conductive pattern, a set of first lumped elements comprising a conductive material including:

a first lumped element connecting the first conductive pattern and the second conductive pattern, a second lumped element connecting the third conductive pattern and a portion of the at least one first ground region, a third lumped element connecting the third conductive pattern and the fourth conductive pattern, a fourth lumped element connecting the fourth conductive pattern and an other portion of the at least one first ground region that is different from the portion of the at least one first ground region, a fifth lumped element connecting the second conductive pattern and the fifth conductive pattern, and a sixth lumped element connecting the third conductive pattern and the fifth conductive pattern, and wherein the third conductive pattern, the fourth conductive pattern, and the at least one first ground region form a closed loop by the second lumped element, the third lumped element, and the fourth lumped element.

2. The electronic device of claim 1, wherein the portion of the at least one first ground region faces the third conductive pattern and the fourth conductive pattern and extends in the second direction, wherein the other portion of the at least one first ground region faces an end of the fourth conductive pattern facing the second direction and extends in the first direction.

3. The electronic device of claim 1, wherein the first conductive pattern includes:

a first portion extending in the first direction and facing the second conductive pattern, and a second portion, extending in the second direction, connected to the first portion and the other end of the chip antenna, and wherein the first lumped element connects the first portion and the second conductive pattern.

4. The electronic device of claim 1, wherein the fourth conductive pattern is spaced apart from the third conductive pattern in the second direction.

5. The electronic device of claim 1, wherein the second antenna module includes:

a second feeding line, different from a first feeding line which is the feeding line, spaced apart from the first feeding line in the first direction, a second chip antenna, different from a first chip antenna which is the chip antenna, spaced apart from the second feeding line, at least one second ground region, different from the at least one first ground region, surrounding the second chip antenna and the second feeding line, a set of second conductive patterns, different from the set of first conductive patterns, the set of second conductive patterns including:

a sixth conductive pattern spaced apart from the second feeding line and connected to an end of the second chip antenna, and a seventh conductive pattern, connected to another end of the second chip antenna and a portion of the at least one second ground region, spaced apart from an other portion of the at least one second ground region different from the portion of the at least one second ground region, and a seventh lumped element connecting the second feeding line and the sixth conductive pattern.

6. The electronic device of claim 5, wherein the seventh conductive pattern includes:

a third portion extending from the portion of the at least one second ground region in the first direction, an end of the third portion spaced apart from the other portion of the at least one second ground region, and a fourth portion extending from the third portion in the second direction, a portion of the fourth portion connected to the other end of the second chip antenna.

7. The electronic device of claim 5, wherein a portion of the second feeding line extends in a direction inclined with respect to the first direction between the portion of the at least one second ground region and the other portion of the at least one second ground region.

8. The electronic device of claim 5, wherein an area of the at least one first ground region is less than an area of the at least one second ground region.

9. The electronic device of claim 1, wherein the Bluetooth module includes:

a third chip antenna, different from a first chip antenna which is the chip antenna, disposed on the second region, a third feeding line, different from a first feeding line which is the feeding line, spaced apart from the third chip antenna in the first direction, at least one third ground region, different from the at least one first ground region, surrounding the third chip antenna and the third feeding line, a set of third conductive patterns, different from the set of first conductive patterns, the set of third conductive patterns including:

an eighth conductive pattern, contacted with an end of the third chip antenna, spaced apart from the third feeding line, a ninth conductive pattern disposed between a portion of the at least one third ground region and another portion of the at least one third ground region, a tenth conductive pattern spaced apart from the ninth conductive pattern in the first direction, and an eleventh conductive pattern disposed between the tenth conductive pattern and the other portion of the at least one third ground region, and a set of second lumped elements, different from the set of first lumped elements, the set of second lumped elements including:

an eighth lumped element connecting the third feeding line and the eighth conductive pattern, a ninth lumped element connecting the portion of the at least one third ground region and the ninth conductive pattern, a tenth lumped element connecting the ninth conductive pattern and the tenth conductive pattern, an eleventh lumped element connecting the tenth conductive pattern and the eleventh conductive pattern, and a twelfth lumped element connecting the eleventh conductive pattern and the other portion of the at least one third ground region.

10. The electronic device of claim 1, wherein the second region is connected to a portion of the first region spaced from both peripheries of the first region.

11. The electronic device of claim 1, further comprising:

a first microphone spaced apart from the first antenna module in the first direction; and a second microphone, spaced apart from the first microphone in the first direction, and disposed on another periphery of the first region facing the first direction.

12. The electronic device of claim 1, further comprising a shield can, disposed over the at least one processor, surrounding the at least one processor, and wherein the at least one processor and the shield can are surrounded by the first antenna module, the second antenna module, and the Bluetooth module.

13. The electronic device of claim 1, further comprising a connector, disposed between the first antenna module and the second antenna module, configured to electrically connect the PCB and another PCB.

14. The electronic device of claim 1, further comprising a plurality of via holes disposed in the at least one first ground region, penetrating at least a portion of the PCB, and spaced apart from each other.

15. An antenna module comprising:

a printed circuit board (PCB);

a chip antenna disposed on the PCB;

a feeding line connected to an end of the chip antenna;

at least one first ground region, surrounding the chip antenna and the feeding line, disposed along a portion of a periphery of the PCB, a set of first conductive patterns including:

a first conductive pattern connected to an other end of the chip antenna, a second conductive pattern spaced apart from the first conductive pattern and extending in a first direction, a third conductive pattern disposed between a portion of the at least one first ground region and an other end of the second conductive pattern, a fourth conductive pattern spaced apart from the third conductive pattern and extending in a second direction perpendicular to the first direction, and a fifth conductive pattern disposed between the second conductive pattern and the third conductive pattern; and a set of first lumped elements comprising a conductive material including:

a first lumped element connecting the first conductive pattern and the second conductive pattern, a second lumped element connecting the third conductive pattern and the portion of the at least one first ground region, a third lumped element connecting the third conductive pattern and the fourth conductive pattern, a fourth lumped element connecting the fourth conductive pattern and an other portion of the at least one first ground region, a fifth lumped element connecting the second conductive pattern and the fifth conductive pattern, and a sixth lumped element connecting the third conductive pattern and the fifth conductive pattern, wherein the third conductive pattern, the fourth conductive pattern, and the at least one first ground region forms a closed loop by the second lumped element, the third lumped element, and the fourth lumped element.

16. The antenna module of claim 15, wherein the portion of the at least one first ground region faces the third conductive pattern and the fourth conductive pattern and extend in the second direction, and wherein the other portion of the at least one first ground region faces an end of the fourth conductive pattern facing the second direction and extend along the first direction.

17. The antenna module of claim 15, wherein the first conductive pattern includes:

a first portion extending in the first direction and facing the second conductive pattern, and a second portion extending in the second direction and connected to the first portion and the other end of the chip antenna, and wherein the first lumped element connects the first portion and the second conductive pattern.

* * * * *